(12) United States Patent
Jeng

(10) Patent No.: US 6,727,836 B2
(45) Date of Patent: Apr. 27, 2004

(54) METHOD AND APPARATUS FOR DIGITAL-TO-ANALOG SIGNAL CONVERSION

(75) Inventor: Ming-Fure Jeng, Chiayi Hsien (TW)

(73) Assignee: Constel Signal Processing Co. Ltd., Taipei (TW)

( * ) Notice: Subject to any disclaimer, the term of this patent is extended or adjusted under 35 U.S.C. 154(b) by 0 days.

(21) Appl. No.: 10/144,045

(22) Filed: May 14, 2002

(65) Prior Publication Data

US 2003/0214425 A1 Nov. 20, 2003

(51) Int. Cl.$^7$ ................................................ H03M 1/66
(52) U.S. Cl. ..................... 341/150; 341/144; 341/172
(58) Field of Search ................................ 341/150, 144, 341/155, 172

(56) References Cited

U.S. PATENT DOCUMENTS

| | | | | |
|---|---|---|---|---|
| 4,384,276 A | * | 5/1983 | Kelley et al. | 341/150 |
| 5,627,538 A | * | 5/1997 | Ferry | 341/144 |
| 5,959,565 A | * | 9/1999 | Taniuchi et al. | 341/172 |
| 6,067,037 A | * | 5/2000 | Kato | 341/150 |
| 6,268,818 B1 | * | 7/2001 | Xin et al. | 341/144 |
| 6,486,812 B1 | * | 11/2002 | Tanaka | 341/144 |

* cited by examiner

Primary Examiner—Michael Tokar
Assistant Examiner—Lam Mai
(74) Attorney, Agent, or Firm—Bacon & Thomas, PLLC

(57) ABSTRACT

In a method and apparatus for digital-to-analog signal conversion, each of a plurality of first capacitors is charged during a first time period in accordance with an associated data bit of an input data byte. During a second time period that follows the first time period, the first capacitors are connected to a second capacitor for charge redistribution. During a third time period that follows the second time period, the second capacitor is connected to an operational amplifier to generate an analog output corresponding to the input data byte.

52 Claims, 12 Drawing Sheets

METHOD AND APPARATUS FOR DIGITAL-TO-ANALOG SIGNAL CONVERSION

BACKGROUND OF THE INVENTION

1. Field of the Invention

The invention relates to a method and apparatus for digital-to-analog signal conversion, more particularly to a digital-to-analog signal conversion method and apparatus suitable for high-order low-pass filtering.

2. Description of the Related Art

Referring to FIG. 1, a conventional digital-to-analog converter 1 is shown to include an operational amplifier 11, a plurality of capacitors (C1, C2, ..., Cn), a plurality of first switches (S10), a plurality of second switches (S11), a plurality of third switches (S12), and a fourth switch (S13). The operational amplifier 11 has a grounded non-inverting input 111, an inverting input 112, an output 113, and a feedback capacitor ($C_{FB}$) connected between the inverting input 112 and the output 113. Each of the capacitors (C1, C2, ..., Cn) has a first capacitor terminal connected to one of the first switches (S10) and one of the second switches (S11), and a second capacitor terminal connected to one of the third switches (S12) and to the fourth switch (S13). Each of the first switches (S11) connects the first capacitor terminal of a respective one of the capacitors (C1, C2, ..., Cn) to a positive or negative reference voltage ($V_r^+$ or $V_r^-$). Each of the second switches (S11) connects the first capacitor terminal of a respective one of the capacitors (C1, C2, ..., Cn) to the output 113 of the operational amplifier 11. Each of the third switches (S12) connects the second capacitor terminal of a respective one of the capacitors (C1, C2, ..., Cn) to a ground terminal. The fourth switch (S13) connects the second capacitor terminals of the capacitors (C1, C2, ..., Cn) to the inverting input 112 of the operational amplifier 11.

In the converter 1, digital-to-analog conversion is performed in two time periods. During the first time period, the first and third switches (S10, S12) are closed, whereas the second and fourth switches (S11, S13) are opened, thereby charging the capacitors (C1, C2, ..., Cn) using either the positive or negative reference voltage ($V_r^+$ or $V_r^-$). Particularly, if an associated data bit of an input data byte is at a high logic level (i.e., 1), the first switch (S10) connects the respective capacitor (C1, C2, ..., Cn) to the positive reference voltage ($V_r^+$), and if the associated data bit of the input data byte is at a low logic level (i.e., 0), the first switch (S10) connects the respective capacitor (C1, C2, ..., Cn) to the negative reference voltage ($V_r^-$). Subsequently, during the second time period, the first and third switches (S10, S12) are opened, whereas the second and fourth switches (S11, S13) are closed. At this time, the capacitors (C1, C2, ..., Cn) and the feedback capacitor ($C_{FB}$) are connected in parallel between the inverting input 112 and the output 113 of the operational amplifier 11, thereby redistributing charges among the capacitors (C1, C2, ..., Cn) and the feedback capacitor ($C_{FB}$) for conducting n-to-1 digital-to-analog signal conversion.

However, if the above-described conventional converter 1 is expanded to achieve a high-order low-pass filtering effect, i.e., −3 DB low frequency cutoff frequency setting, the required capacitance value of the feedback capacitor ($C_{FB}$) will accordingly increase, thereby resulting in a larger layout area requirement.

FIG. 2 shows another conventional digital-to-analog converter 2. In the converter 2, each of an inverting input 211 and a non-inverting input 212 of an operational amplifier 21 is connected to two switch-capacitor arrays 22, such as that shown in FIG. 2A. The conversion function thereof is:

$$\frac{1/2(1+Z^{-1})}{1+\dfrac{C_{FB}}{C_{DAC}}-\left(\dfrac{C_{FB}}{C_{DAC}}\right)Z^{-1}}$$

where $C_{DAC}=2(C_1+C_1+\ldots+C_{31})$. It is evident that the capacitance value of the feedback capacitors ($C_{FB}$) increase with that of $C_{DAC}$. Since $C_{DAC}$ is the total capacitance of $C_1$, $C_2$, ..., $C_{31}$, a very large $C_{FB}$ value will result, which leads to increased volume. In addition, too many capacitors are required, which is not economical.

SUMMARY OF THE INVENTION

Therefore, the main object of the invention is to provide a digital-to-analog signal conversion method and apparatus suitable for high-order low-pass filtering and capable of overcoming the aforesaid drawbacks of the prior art.

According to one aspect of the invention, a digital-to-analog converter comprises:

- an operational amplifier;
- a plurality of first capacitors;
- a charging unit connected to the first capacitors during a first time period for charging each of the first capacitors in accordance with an associated data bit of an input data byte;
- a second capacitor;
- a switch set for connecting the first capacitors to the second capacitor during a second time period that follows the first time period; and
- a switch unit for connecting the second capacitor to the operational amplifier during a third time period that follows the second time period.

According to another aspect of the invention, a digital-to-analog converter comprises:

- an operational amplifier;
- a plurality of first capacitors;
- a charging unit connected to the first capacitors during a first time period for charging each of the first capacitors in accordance with an associated data bit of an input data byte;
- a plurality of second capacitors;
- a switch set for connecting the first capacitors to the second capacitors during a second time period, wherein clock pulses of the second time period follow clock pulses of the first time period, and wherein the switch set connects the first capacitors to each of the second capacitors in sequence under the control of the clock pulses of the second time period; and
- a switch unit for connecting the second capacitors simultaneously to the operational amplifier during a third time period that follows the second time period.

According to another aspect of the invention, a digital-to-analog converter comprises:

- an operational amplifier;
- two first capacitor sets, each including a plurality of first capacitors;
- two charging units connected respectively to the first capacitor sets during a first time period for charging each of the first capacitors of the respective one of the first capacitor sets in accordance with an associated data bit of an input data byte;

two second capacitors;

a switch set for connecting each of the first capacitor sets to a respective one of the second capacitors during a second time period that follows the first time period; and a switch unit for connecting the second capacitors simultaneously to the operational amplifier during a third time period that follows the second time period;

the operational amplifier having two inputs and two outputs, the switch unit connecting each of the second capacitors between a respective one of the inputs and a respective one of the outputs of the operational amplifier during the third time period.

According to another aspect of the invention, a digital-to-analog converter comprises:

an operational amplifier;

a plurality of first capacitors;

first and second charging units connected to the first capacitors during a first time period, wherein each of the first capacitors is charged by the first charging unit in accordance with an associated data bit of an input data byte during a first clock pulse of the first time period, and is charged by the second charging unit in accordance with the associated data bit of the input data byte during a second clock pulse of the first time period;

two second capacitors;

a switch set for connecting the first capacitors to the second capacitors during a second time period, wherein the switch set connects the first capacitors to one of the second capacitors after the first clock pulse of the first time period and to the other of the second capacitors after the second clock pulse of the first time period; and a switch unit for connecting the second capacitors simultaneously to the operational amplifier during a third time period that follows the second time period.

According to another aspect of the invention, a digital-to-analog converter comprises:

an operational amplifier;

two first capacitor sets, each including a plurality of first capacitors;

two charging units connected respectively to the first capacitor sets during a first time period for charging each of the first capacitors of the respective one of the first capacitor sets in accordance with an associated data bit of an input data byte;

two second capacitor sets, each including a plurality second capacitors;

a switch set for connecting the first capacitor sets to the second capacitor sets respectively during a second time period, wherein clock pulses of the second time period follow clock pulses of the first time period, and wherein the switch set connects the first capacitors of each of the first capacitor sets to each of the second capacitors of the respective one of the second capacitor sets in sequence under the control of the clock pulses of the second time period; and a switch unit for connecting the second capacitor sets simultaneously to the operational amplifier during a third time period that follows the second time period.

According to another aspect of the invention, a digital-to-analog converter comprises:

an operational amplifier;

a first capacitor set including a plurality of first capacitors;

first and second charging units connected to the first capacitor set during a first time period, wherein each of the first capacitors is charged by the first charging unit in accordance with an associated data bit of an input data byte during a first clock pulse of the first time period, and is charged by the second charging unit in accordance with the associated data bit of the input data byte during a second clock pulse of the first time period;

two second capacitors sets each including a plurality of second capacitors;

a switch set for connecting the first capacitor set alternately to the second capacitor sets during a second time period, wherein clock pulses of the second time period follow clock pulses of the first time period, and wherein the switch set connects the first capacitor set to each of the second capacitors of the second capacitor sets in sequence under the control of the clock pulses of the second time period; and a switch unit for connecting the second capacitor sets simultaneously to the operational amplifier during a third time period that follows the second time period.

According to another aspect of the invention, a digital-to-analog signal conversion method comprises:

during a first time period, charging each of a plurality of first capacitors in accordance with an associated data bit of an input data byte;

during a second time period that follows the first time period, connecting the first capacitors to a second capacitor; and during a third time period that follows the second time period, connecting the second capacitor to an operational amplifier.

According to another aspect of the invention, a digital-to-analog signal conversion method comprises:

during a first time period, charging each of a plurality of first capacitors in accordance with an associated data bit of an input data byte;

during a second time period having clock pulses that follow clock pulses of the first time period, connecting the first capacitors to each of a plurality of second capacitors in sequence under the control of the clock pulses of the second time period; and during a third time period that follows the second time period, connecting the second capacitors simultaneously to an operational amplifier.

According to another aspect of the invention, a digital-to-analog signal conversion method comprises:

during a first time period, charging each of a plurality of first capacitors of two first capacitor sets in accordance with an associated data bit of an input data byte;

during a second time period that follows the first time period, connecting each of the first capacitor sets to a respective one of two second capacitors; and during a third time period that follows the second time period, connecting the second capacitors simultaneously to an operational amplifier such that each of the second capacitors is connected between a respective one of two inputs and a respective one of two outputs of the operational amplifier.

According to another aspect of the invention, a digital-to-analog signal conversion method comprises:

during a first clock pulse of a first time period, charging each of a plurality of first capacitors using a first charging unit in accordance with an associated data bit of an input data byte;

during a second clock pulse of the first time period, charging each of the first capacitors using a second charging unit in accordance with the associated data bit of the input data byte;

during a second time period, connecting the first capacitors to one of two second capacitors after the first clock pulse of the first time period and to the other of the second capacitors after the second clock pulse of the second time period; and during a third time period that follows the second time period, connecting the second capacitors simultaneously to an operational amplifier.

According to another aspect of the invention, a digital-to-analog signal conversion method comprises:

during a first time period, charging each of two first capacitor sets in accordance with an input data byte;

during a second time period having clock pulses that follow clock pulses of the first time period, connecting each of the first capacitor sets to each second capacitor of a respective second capacitor set in sequence under the control of the clock pulses of the second time period; and during a third time period that follows the second time period, connecting the second capacitor sets simultaneously to an operational amplifier.

According to yet another aspect of the invention, a digital-to-analog signal conversion method comprises:

during a first clock pulse of a first time period, charging each of a plurality of first capacitors of a first capacitor set using a first charging unit in accordance with an associated data bit of an input data byte;

during a second clock pulse of the first time period, charging each of the first capacitors using a second charging unit in accordance with the associated data bit of the input data byte;

during a second time period having clock pulses that follow the clock pulses of the first time period, connecting the first capacitor set alternately to two second capacitor sets such that the first capacitor set is connected to each of a plurality of second capacitors of the second capacitor sets in sequence under the control of the clock pulses of the second time period; and during a third time period that follows the second time period, connecting the second capacitor sets simultaneously to an operational amplifier.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
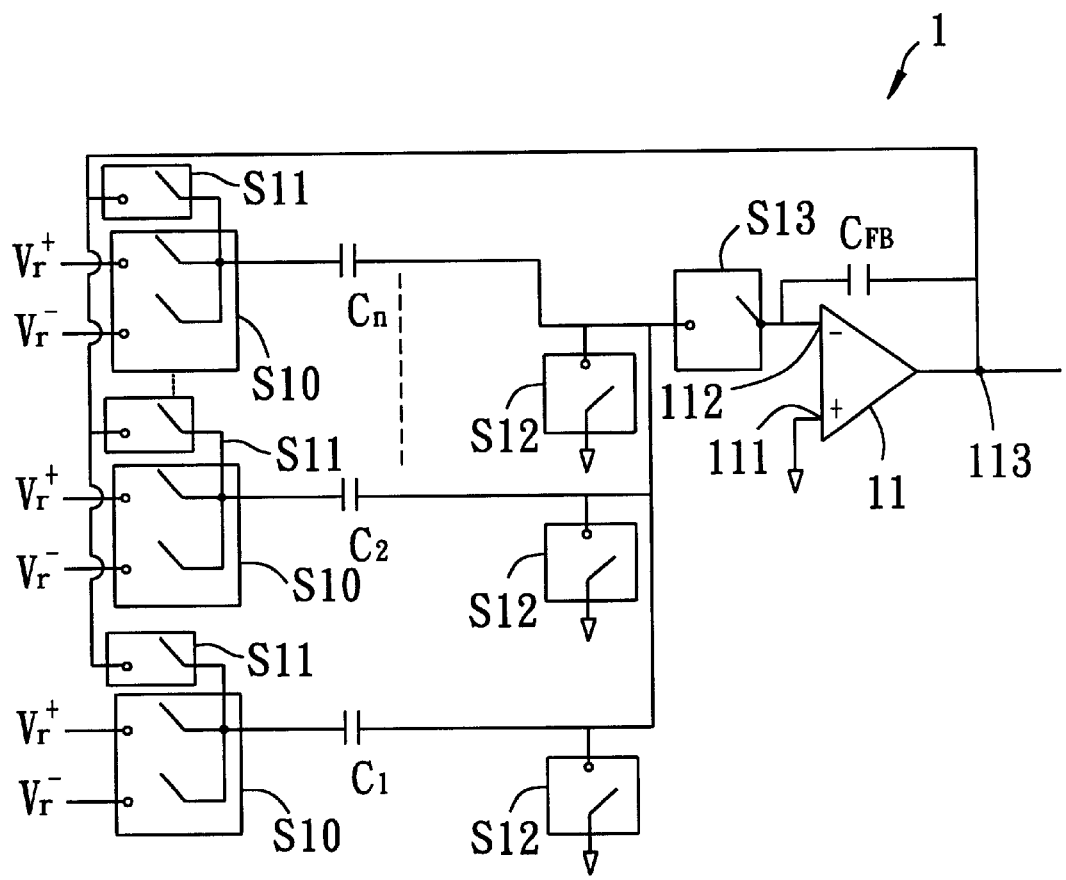
FIG. 1 is a schematic circuit diagram illustrating a conventional digital-to-analog converter.
Figure 2:
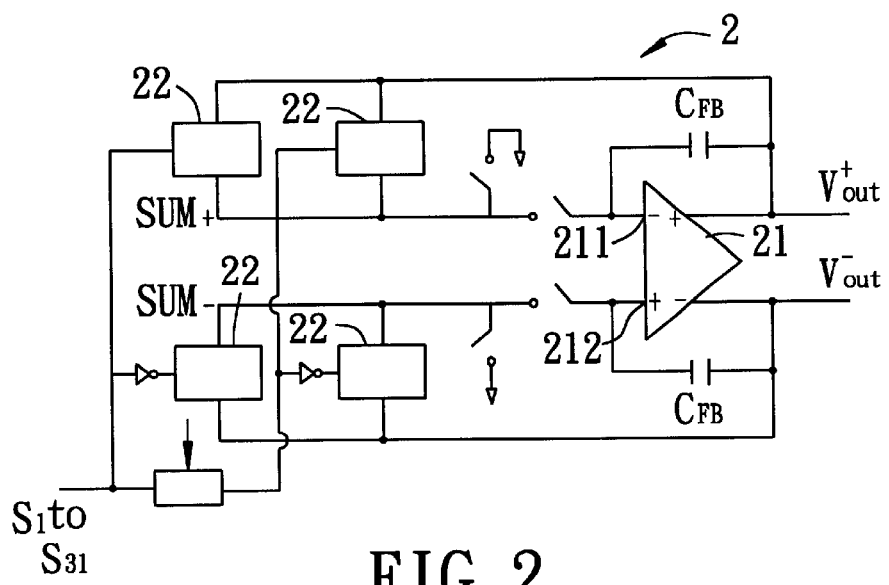
FIG. 2 is a schematic circuit diagram illustrating another conventional digital-to-analog converter.
Figure 2A:
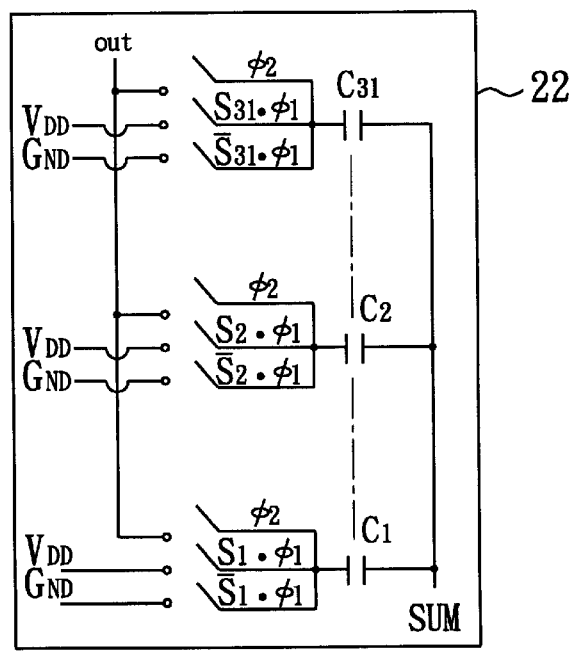
FIG. 2A is a schematic circuit diagram illustrating a switch-capacitor array of the conventional digital-to-analog converter of FIG. 2.

Before the present invention is described in greater detail, it should be noted that like elements are denoted by the same reference numerals throughout the disclosure.

Figure 3:
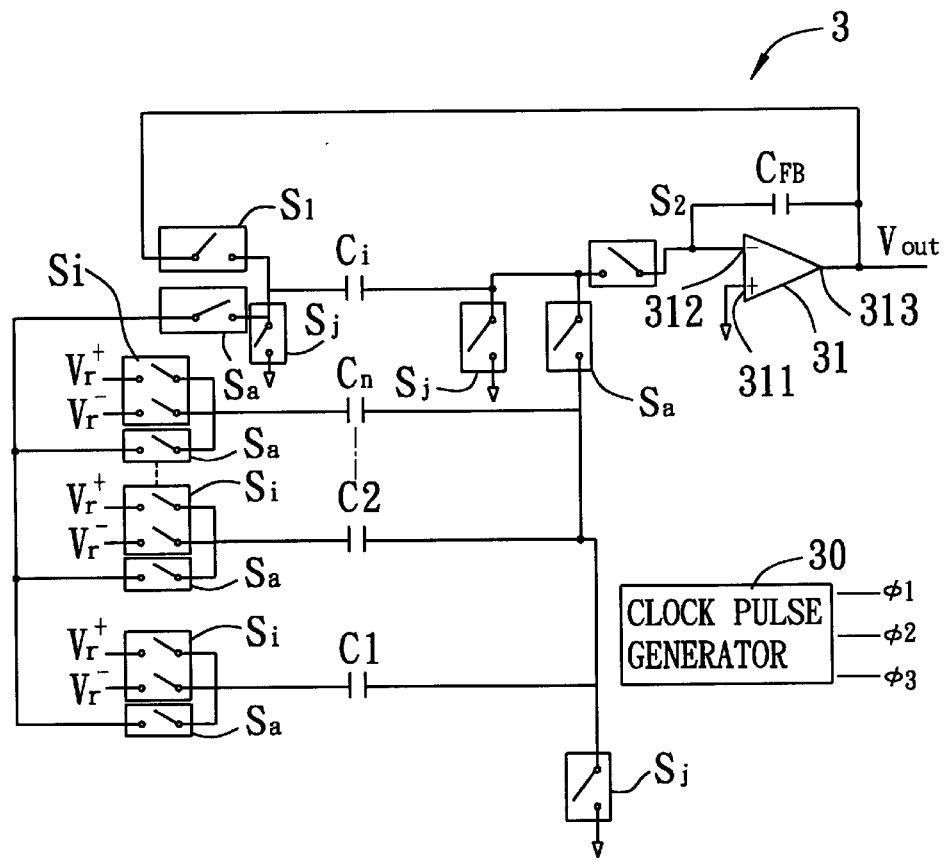
FIG. 3 is a schematic circuit diagram illustrating the first preferred embodiment of a digital-to-analog converter according to the present invention.

Referring to FIG. 3, the first preferred embodiment of a digital-to-analog converter 3 according to the present invention is shown to include an operational amplifier 31, a plurality of first capacitors (C1, C2, . . . Cn), a second capacitor (Ci), a charging unit that includes a plurality of first switches (Si) and three second switches (Sj), a switch set that includes a plurality of third switches (Sa), a switch unit that includes fourth and fifth switches ($S_1$, $S_2$), and a clock pulse generator 30.

The operational amplifier 31 has a grounded non-inverting input 311, an inverting input 312, an output 313, and a feedback capacitor ($C_{FB}$) connected between the inverting input 312 and the output 313. Each of the first capacitors (C1, C2, . . . , Cn) has a first capacitor terminal connected to one of the switches (Si) and one of the switches (Sa), and a second capacitor terminal connected to a ground terminal via one of the switches (Sj) and to the inverting input 312 of the operational amplifier 31 via one of the switches (Sa) and the switch ($S_2$). The second capacitor (Ci) has a first capacitor terminal connected to the output 313 of the operational amplifier 31 via the switch ($S_1$), to the first capacitor terminals of the first capacitors (C1, C2, . . . , Cn) via the switches (Sa), and to the ground terminal via one of the switches (Sj). The second capacitor (Ci) further has a second capacitor terminal connected to the ground terminal via one of the switches (Sj), to the second capacitor terminals of the capacitors (C1, C2, . . . , Cn) via one of the switches (Sa), and to the inverting input 312 of the operational amplifier 31 via the switch ($S_2$). Each of the switches (Si) connects the first capacitor terminal of a respective one of the first capacitors (C1, C2, . . . , Cn) to one of two reference voltages ($V_r^+$ or $V_r^-$), wherein the reference voltage ($V_r^+$) is greater than the reference voltage ($V_r^-$). One of the switches (Sj) connects the first capacitor terminals of the first capacitors (C1, C2, . . . , Cn) to the ground terminal.

Figure 4:
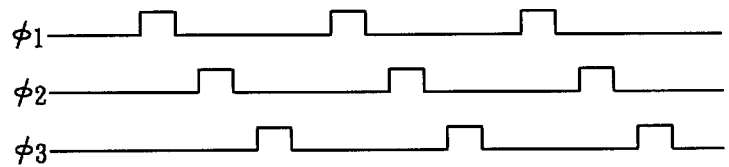
FIG. 4 is a timing diagram illustrating clock signals generated by a clock pulse generator of the converter of the first preferred embodiment.

With further reference to FIG. 4, the clock pulse generator 30 provides three clock signals to the converter 3 such that the latter can operate in a first time period (ϕ1), a second time period (ϕ2), and a third time period (ϕ3). Clock pulses of the second and third time periods (ϕ2, ϕ3) follow those of the first time period (ϕ1). The clock pulses of the third time period (ϕ3) follow those of the second time period (ϕ2).

During the first time period (ϕ1), the switches (Si, Sj) are closed, whereas the switches (Sa, $S_1$, $S_2$) are opened. At this time, the first and second capacitor terminals of the second capacitor (Ci) are grounded to remove charges therein. In addition, the first capacitors (C1, C2, . . . , Cn) are charged using either of the two reference voltages (Vr⁺ or Vr⁻). Particularly, if the associated data bit (D1, D2, . . . , Dn) of an input data byte is at a high logic level (i.e., 1), the first switch (Si) connects the corresponding first capacitor (C1, C2, . . . , Cn) to the larger reference voltage (Vr⁺), and if the associated data bit (D1, D2, . . . , Dn) of the input data byte is at a low logic level (i.e., 0), the first switch (Si) connects the corresponding first capacitor (C1, C2, . . . , Cn) to the smaller reference voltage (Vr⁻). Upon charging, each of the first capacitors (C1, C2, . . . , Cn) has a corresponding charge number, e.g. $Vr.D_1.C1$, $Vr.D_2.C2$, . . . , $Vr.D_n.Cn$, wherein Vr is Vr⁺ or Vr⁻, and Vr⁻ may be equal to 0.

Subsequently, during the second time period (ϕ2), the switches (Si, Sj, $S_1$, $S_2$) are opened, whereas the switches (Sa) are closed. The first capacitors (C1, C2, . . . , Cn) are connected in parallel to the second capacitor (Ci) so that the total charges on the first capacitors (C1, C2, . . . , Cn) are redistributed among the first capacitors (C1, C2, . . . , Cn) and the second capacitor (Ci) at this time. Assuming that the capacitance value of the first capacitors (C1, C2, . . . , Cn) is C, and the capacitance value of the second capacitor (Ci) is wC, the second capacitor (Ci) will have a charge (Qi) equal to $$Qi = Vr(D_1 + D_2 + ... + D_n)\frac{nC}{nC + wC} \cdot wC$$

During the third time period (ϕ3), the switches (Si, Sj, Sa) are opened, whereas the switches ($S_1$, $S_2$) are closed. At this time, the second capacitor (Ci) and the feedback capacitor ($C_{FB}$) are connected in parallel between the inverting input 312 and the output 313 of the operational amplifier 31. The charge (Qi) is redistributed between the second capacitor (Ci) and the feedback capacitor ($C_{FB}$) to thereby obtain Vout ($C_{FB}$+wC) which is equal to $$Vr(D_1 + D_2 + ... + D_n)\frac{nC1}{nC1 + wC1} \cdot wC,$$

and which is processed to obtain a conversion function $$\frac{Vout}{D_1 + D_2 + ... + D_n} = Vr\frac{nC}{nC + wC} \cdot wC/(C_{FB} + wC).$$

The converter 3 thus performs digital-to-analog signal conversion according to this function.

Figure 5:
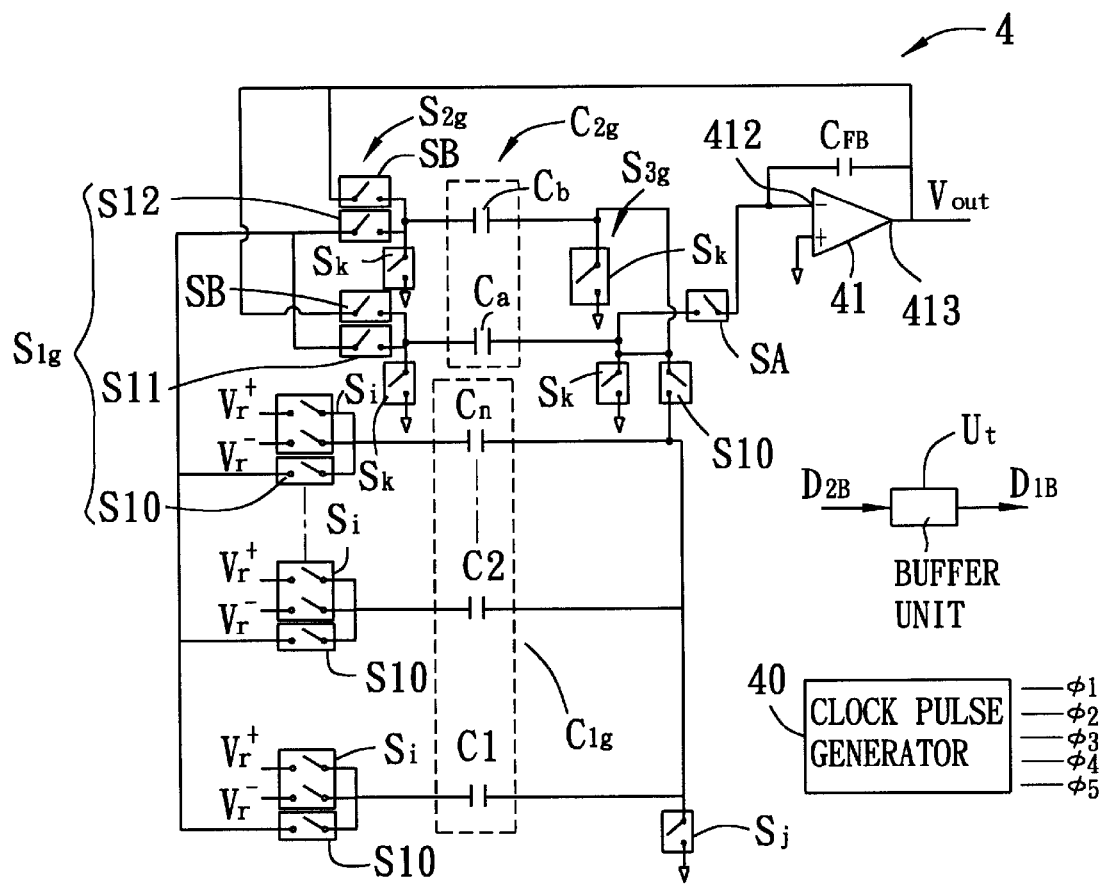
FIG. 5 is a schematic circuit diagram illustrating the second preferred embodiment of a digital-to-analog converter according to the present invention.

FIG. 5 illustrates the second preferred embodiment of a digital-to-analog converter 4 of this invention, which is a modification of the first preferred embodiment. In this embodiment, the converter 4 includes an operational amplifier 41, a first capacitor set ($C_1g$) including a plurality of first capacitors (C1, C2, . . . , Cn), a second capacitor set ($C_2g$) including two second capacitors (Ca, Cb), a charging unit including a plurality of first switches (Si, Sj), a switch set ($S_1g$) including a plurality of second switches (S10, S11, S12), a switch unit ($S_2g$) including a pair of third switches (SA, SB), a grounding unit ($S_3g$) including a plurality of fourth switches (Sk), a buffer unit (Ut), and a clock pulse generator 40.

Since the structural relationship among the operational amplifier 41, the first capacitors (C1, C2, . . . , Cn) of the first capacitor set ($C_1g$), and the first switches (Si, Sj) are the same as those described in connection with the first preferred embodiment, a detailed description of the same will be dispensed with herein for the sake of brevity.

Each of the first capacitors (C1, C2, . . . , Cn) of the first capacitor set ($C_1g$) has a first capacitor terminal connected to a first capacitor terminal of the second capacitors (Ca, Cb) of the second capacitor set ($C_2g$) via a respective one of the switches (S10) and one of the switches (S11, S12) of the switch set ($S_1g$). Each of the first capacitors (C1, C2, . . . , Cn) of the first capacitor set ($C_1g$) further has a second capacitor terminal connected to a second capacitor terminal of the second capacitors (Ca, Cb) of the second capacitor set ($C_2g$) via one of the switches (S10) of the switch set ($S_1g$). The first capacitor terminal of each of the second capacitors (Ca, Cb) of the second capacitor set ($C_2g$) is connected to the output 413 of the operational amplifier 41 via the switch (SB) of the switch unit ($S_2g$) The second capacitor terminal of each of the second capacitors (Ca, Cb) of the second capacitor set ($C_2g$) is connected to the inverting input 412 of the operational amplifier 41 via the switch (SA) of the switch unit ($S_2g$). Each of the switches (Sk) of the grounding unit ($S_3g$) connects one of the first and second capacitor terminals of a respective one of the second capacitors (Ca, Cb) of the second capacitor set ($C_2g$) to the ground terminal.

The buffer unit (Ut) is used to buffer consecutive n-bit data bytes ($D_{1B}$, $D_{2B}$) to be processed by the converter 4 of this embodiment in a first-in first-out (FIFO) manner.

Figure 6:
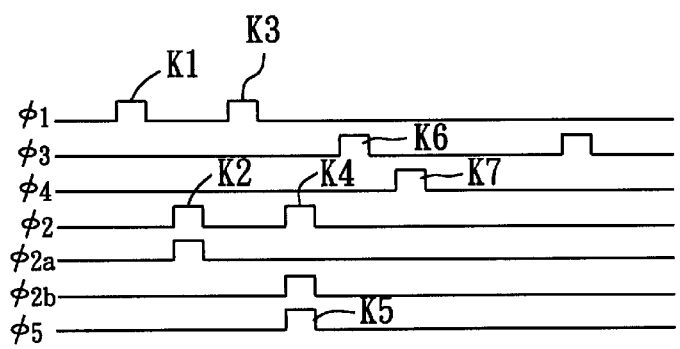
FIG. 6 is a timing diagram illustrating clock signals generated by a clock pulse generator of the converter of the second preferred embodiment.

With further reference to FIG. 6, the clock pulse generator 40 provides five clock signals to the converter 4 such that the latter can operate in a first time period (ϕ1), a second time period (ϕ2), a third time period (ϕ3), a fourth time period (ϕ4), and a fifth time period (ϕ5).

During a first clock pulse (K1) of the first time period (ϕ1), the switches (Si, Sj) are closed, and the other switches are opened. At this time, the first capacitors (C1, C2, . . . , Cn) are charged using either of the two reference voltages (Vr⁺ or Vr⁻). Particularly, if the associated data bit (D1, D2, . . . , Dn) of a first data byte ($D_{1B}$) from the buffer unit (Ut) is at a high logic level (i.e., 1), the switch (Si) connects the corresponding first capacitor (C1, C2, . . . , Cn) to the larger reference voltage (Vr⁺), and if the associated data bit (D1, D2, . . . , Dn) of the first data byte ($D_{1B}$) from the buffer unit (Ut) is at a low logic level (i.e., 0), the switch (Si) connects the corresponding first capacitor (C1, C2, . . . , Cn) to the smaller reference voltage (Vr⁻). Upon charging, each of the first capacitors (C1, C2, . . . , Cn) has a corresponding charge number, e.g. $Vr.D_1.C1$, $Vr.D_2.C2$, . . . , $Vr.D_n.Cn$.

Subsequently, during a first clock pulse (K2) of the second time period (ϕ2), i.e. sub-period (ϕ2a), which follows the first clock pulse (K1) of the first time period (ϕ1), the switches (S10, S11) are closed, and the other switches are opened. The first capacitors (C1, C2, . . . , Cn) are connected in parallel to the second capacitor (Ca) so that the total charges on the first capacitors (C1, C2, ... , Cn) are redistributed among the first capacitors (C1, C2, ... , Cn) and the second capacitor (Ca) at this time. Assuming that the capacitance value r of the first capacitors (C1, C2, ... , Cn) is C, and the capacitance value of the second capacitor (Ca) is wC, the second capacitor (Ca) will have a charge ($Q_1$) equal to $$Q_1 = Vr(D_1 + D_2 + \ldots + D_n)\frac{nC}{nC + wC} \cdot wC.$$

During a second clock pulse (K3) of the first time period ($\phi 1$), which follows the first clock pulse (K2) of the second time period ($\phi 2$), the switches (Si, Sj) are once again closed, with the other switches opened. Like the first clock pulse (K1) of the first time period ($\phi 1$), the first capacitors (C1, C2, ... , Cn) are charged using either of the two reference voltages ($Vr^+$, $Vr^-$). However, unlike the first clock pulse (K1) of the first time period ($\phi 1$), connection of the first capacitors (C1, C2, ... , Cn) to either of the two reference voltages ($Vr^+$, $Vr^-$) is determined according to the data bits ($Z^{-1}D1$, $Z^{-1}D2$, ... , $Z^{-1}Dn$) of a second data byte ($D_{2B}$) from the buffer unit (Ut).

Thereafter, during a second clock pulse (K4) of the second time period ($\phi 2$), i.e. sub-period ($\phi 2b$), which follows the second clock pulse (K3) of the first time period ($\phi 1$), the switches (S10, S12) are closed so that the first capacitors (C1, C2, ... , Cn) are connected in parallel to the second capacitor (Cb). The total charges on the first capacitors (C1, C2, ... , Cn) are redistributed among the first capacitors (C1, C2, ... , Cn) and the second capacitor (Cb) at this time. Assuming that the capacitance value of the first capacitors (C1, C2, ... , Cn) is C, and the capacitance value of the second capacitor (Cb) is wC, the second capacitor (Cb) will have a charge ($Q_2$) equal to $$Q_2 = VrZ^{-1}(D_1 + D_2 + \ldots + D_n)\frac{nC}{nC + wC} \cdot wC.$$

The fifth time period ($\phi 5$) occurs simultaneously with the sub-period ($\phi 2b$). For each clock pulse (K5) of the fifth time period ($\phi 5$), a previous data byte ($D_{1B}$) will be outputted by the buffer unit (Ut), and a new data byte ($D_{2B}$) will be stored in the buffer unit (Ut).

The clock pulse (K6) of the third time period ($\phi 3$) occurs after the second clock pulse (K4) of the second time period ($\phi 2$). During the third time period $\phi 3$), the switches (SA, SB) of the switch unit ($S_2g$) are closed so that the second capacitor set ($C_2g$) and the feedback capacitor ($C_{FB}$) are connected in parallel between the inverting input 412 and the output 413 of the operational amplifier 41. At this time, the total charges $Q_1+Q_2$ on the second capacitors (Ca, Cb) are redistributed among the second capacitors (Ca, Cb) and the feedback capacitor ($C_{FB}$) to obtain:

$$Vout(t-1) \cdot C_{FB} + Vr(D_1 + D_2 + \ldots + Dn)[1 + Z^{-1}]\frac{nC}{nC + wC} \cdot wC =$$
$$Vout(t)(C_{FB} + 2Wc - C_{FB}Z^{-1})$$

which can be simplified to obtain a conversion function $$\frac{Vout}{D_1 + D_2 + \ldots + Dn} = Vr[1 + Z^{-1}]\frac{nC}{nC + wC} \cdot wC/(C_{FB} + 2wC - C_{FB}Z^{-1}).$$

An analog signal according to the aforesaid conversion function can be obtained from the output 413 of the operational amplifier 41 at this time.

Each clock pulse (K7) of the fourth time period $\phi 4$ occurs after a corresponding clock pulse (K6) of the third clock period ($\phi 3$). During the fourth time period ($\phi 4$), all of the switches (Sk) are closed, with the other switches opened, thereby grounding the first and second capacitor terminals of the second capacitors (Ca, Cb) to remove charges thereon.

Note that the next clock pulse of the first time period ($\phi 1$) can occur simultaneously with the clock pulse (K6) of the third time period ($\phi 3$) to speed up the conversion process. Under such condition, the next clock pulse of the second time period ($\phi 2$) occurs after the clock pulse (K9) of the fourth time period ($\phi 4$).

Figure 7:
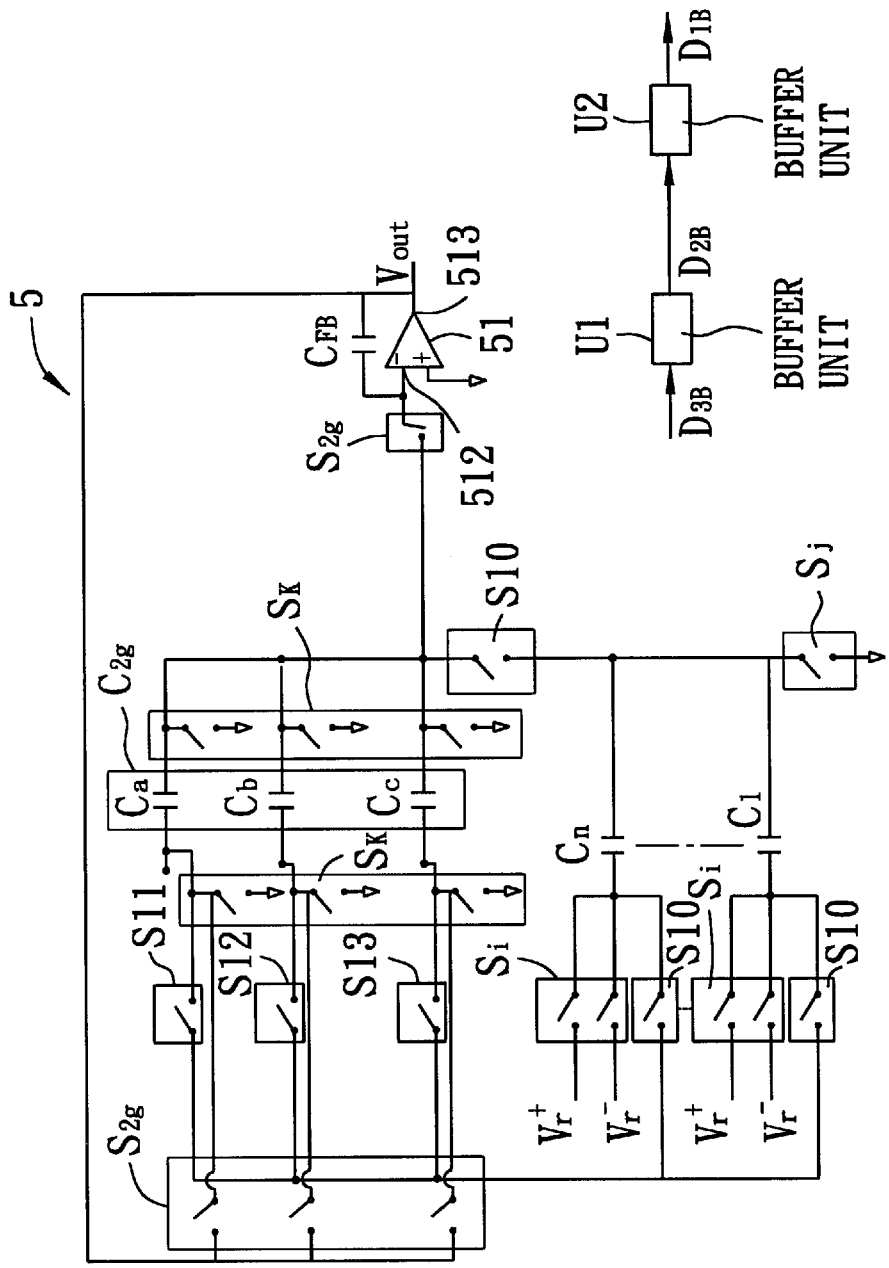
FIG. 7 is a schematic circuit diagram illustrating the third preferred embodiment of a digital-to-analog converter according to the present invention.

FIG. 7 illustrates the third preferred embodiment of a digital-to-analog converter 5 of this invention, which is a modification of the second preferred embodiment. Unlike the second preferred embodiment, the second capacitor set ($C_2g$) in the converter 5 includes three second capacitors (Ca, Cb, Cc), and switches (S10, S11, S12, S13) of a switch set connect the second capacitors (Ca, Cb, Cc) to the first capacitors (C1, C2, ... , Cn). The switch unit ($S_2g$) connects the second capacitors (Ca, Cb, Cc) to the inverting input 512 and to the output 513 of the operational amplifier 51. In addition, the converter 5 includes cascaded buffer units (U1, U2) to buffer consecutive n-bit data bytes ($D_{1B}$, $D_{2B}$, $D_{3B}$).

Figure 8:
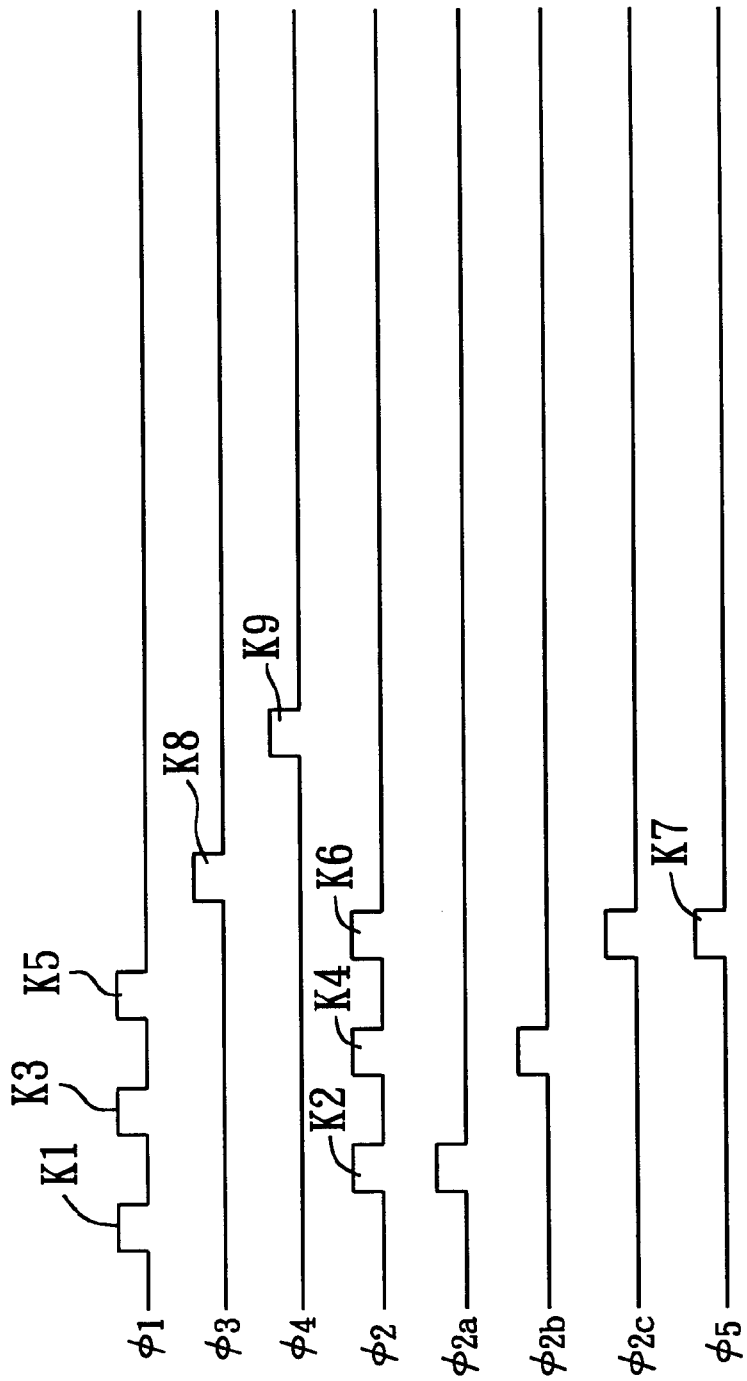
FIG. 8 is a timing diagram illustrating clock signals generated by a clock pulse generator of the converter of the third preferred embodiment.

With further reference to FIG. 8, during a first clock pulse (K1) of a first time period ($\phi 1$), the switches (Si, Sj) are closed, and the other switches are opened. The first capacitors (C1, C2, ... , Cn) are thus charged according to the data bits of the first data byte ($D_{1B}$) in the manner described beforehand. During a first clock pulse (K2) of the second time period ($\phi 2$), i.e. sub-period ($\phi 2a$), which follows the first clock pulse (k1) of the first time period ($\phi 1$), the switches (S10, S11) are closed, and the other switches are opened. The first capacitors (C1, C2, ... , Cn) are connected in parallel to the second capacitor (Ca) so that the total charges on the first capacitors (C1, C2, ... , Cn) are redistributed among the first capacitors (C1, C2, ... , Cn) and the second capacitor (Ca) at this time. Therefore, the second capacitor (Ca) has a charge $$Q_1 = Vr(D_1 + D_2 + \ldots + D_n)\frac{nC}{nC + wC} \cdot wC.$$

Thereafter, during a second clock pulse (K3) of the first time period ($\phi 1$), which follows the first clock pulse (K2) of the second time period ($\phi 2$), the first capacitors (C1, C2, ... , Cn) are charged according to the data bits ($Z^{-1}D1$, $Z^{-1}D2$, ... , $Z^{-1}Dn$) of the second data byte ($D_{2B}$) from the buffer units (U1, U2). Subsequently, during a second clock pulse (K4) of the second time period ($\phi 2$), i.e. sub-period ($\phi 2b$), which follows the second clock pulse (K3) of the first time period ($\phi 1$), the switches (S10, S12) are closed so that the first capacitors (C1, C2, ... , Cn) are connected in parallel to the second capacitor (Cb). The total charges on the first capacitors (C1, C2, ... , Cn) are redistributed among the first capacitors (C1, C2, ... , Cn) and the second capacitor (Cb) at this time. Therefore, the second capacitor (Cb) will have a charge $Q_2 = VrZ^{-1}$ ($D_1+D_2+ \ldots +Dn$)

$$\frac{nC}{nC + wC} \cdot wC.$$

Thereafter, during a third clock pulse (K5) of the first time period ($\phi 1$), which follows the second clock pulse (K4) of the second time period ($\phi 2$), the first capacitors (C1, C2, ... , Cn) are charged according to the data bits ($Z^{-2}D1$, $Z^{-2}D2$, ... , $Z^{-2}Dn$) of the third data byte ($D_{3B}$) from the buffer units (U1, U2). Subsequently, during a third clock pulse (K6) of the second time period (φ2), i.e. sub-period (φ2c), which follows the third clock pulse (K5) of the first time period (φ1), the switches (S10, S13) are closed so that the first capacitors (C1, C2, ..., Cn) are connected in parallel to the second capacitor (Cc). The total charges on the first capacitors (C1, C2, ..., Cn) are redistributed among the first capacitors (C1, C2, ..., Cn) and the second capacitor (Cc) at this time. Therefore, the second capacitor (Cc) will have a charge $Q_3 = VrZ^{-2}(D_1 + D_2 + \ldots + Dn)$ $$\frac{nC}{nC + wC} \cdot wC.$$

The fifth time period (φ5) occurs simultaneously with the sub-period (φ2c). For each clock pulse (K7) of the fifth time period (φ5), data bytes ($D_{1B}$, $D_{2B}$) will be outputted by the buffer units (U2, U1), respectively, and a new data byte ($D_{3B}$) will be stored in the buffer unit (U1).

The clock pulse (K8) of the third time period (φ3) occurs after the third clock pulse (K6) of the second time period (φ2). During the third time period (φ3), the switch unit ($S_2g$) is closed so that the second capacitor set ($C_2g$) and the feedback capacitor ($C_{FB}$) are connected in parallel between the inverting input 512 and the output 513 of the operational amplifier 51. The total charges on the second capacitors (Ca, Cb, Cc) are redistributed among the second capacitors (Ca, Cb, Cc) and the feedback capacitor ($C_{FB}$) to obtain a third-order conversion function. An analog signal corresponding to the conversion function can be obtained from the output 513 of the operational amplifier 51 at this time.

Each clock pulse (K9) of the fourth time period (φ4) occurs after a corresponding clock pulse (K8) of the third clock period (φ3). During the fourth time period (φ4), all of the switches (Sk) are closed, with the other switches opened, thereby grounding the first and second capacitor terminals of the second capacitors (Ca, Cb, Cc) to remove charges thereon.

To speed-up the conversion process, the next clock pulse of the first time period (φ1) can occur simultaneously with the clock pulse (K8) of the third time period (φ3). Under this condition, the next clock pulse of the second time period (φ2) occurs after the clock pulse (K9) of the fourth time period (φ4).

Therefore, it can be inferred from the foregoing that the converter of this invention can be expanded into an N-order converter, with N being an integer greater than 2. The expanded converter differs from the converters of the previous embodiments mainly in the number of the second capacitors in the second capacitor set ($C_2g$), the number of switches in the switch set and the switch unit, and the number of cascaded buffer units. The N-order converter is still operable in five time periods. During the clock pulses of the first time period, the first capacitors of the first capacitor set ($C_1g$) are charged according to data bits of consecutive data bytes from the buffer unit. Under the control of the clock pulses of the second time period, which follow the clock pulses of the first time period, the first capacitor set ($C_1g$) is connected to each of the second capacitors in the second capacitor set ($C_2g$) in sequence for charge redistribution. During each clock pulse of the third time period, which follows the second time period, the second capacitor set ($C_2g$) is connected to the feedback capacitor ($C_{FB}$) of the operational amplifier to result in an analog output. During each clock pulse of the fourth time period, which follows the third time period, the capacitor terminals of the second capacitors of the second capacitor set (C2g) are grounded to remove charges thereon. During each clock pulse of the fifth time period, which is simultaneous with each Nth clock pulse of the second time period, a new data byte will be inputted into the cascaded buffer units.

Figure 9:
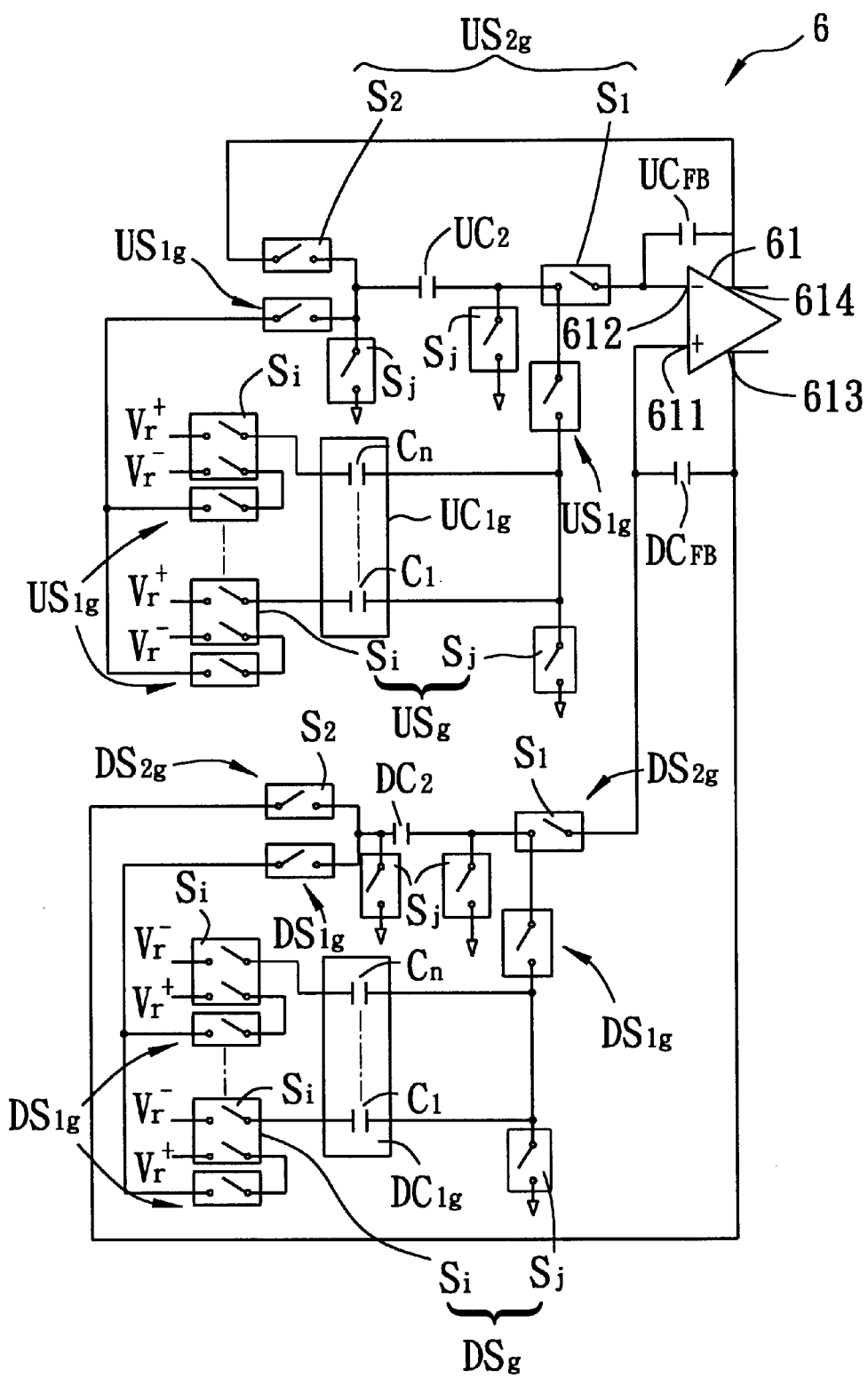
FIG. 9 is a schematic circuit diagram illustrating the fourth preferred embodiment of a digital-to-analog converter according to the present invention.

Referring to FIG. 9, the fourth preferred embodiment of a digital-to-analog converter 6 according to this invention is shown to include an operational amplifier 61, two first capacitor sets ($UC_1g$, $DC_1g$) each having a plurality of first capacitors (C1, C2, ..., Cn), two second capacitors ($UC_2$, $DC_2$), two charging units (USg, DSg) each having a plurality of first switches (Si, Sj), two switch sets ($US_1g$, $DS_1g$) and two switch units ($US_2g$, $DS_2g$) each having a pair of third switches ($S_1$, $S_2$). The operational amplifier 61 has non-inverting and inverting inputs 611, 612, first and second differential outputs 613, 614, and two feedback capacitors ($UC_{FB}$, $DC_{FB}$), which are connected respectively between the non-inverting input 611 and the first differential output 613 and between the inverting input 612 and the second differential output 614. The switch ($S_1$) of each of the switch units ($US_2g$, $DS_2g$) is connected between one of the second capacitors ($UC_2$, $DC_2$) and one of the inverting and non-inverting inputs 612, 611 of the operational amplifier 61. The other switch ($S_2$) of each of the switch units ($UC_2$, $DC_2$) is connected between one of the second capacitors ($UC_2$, $DC_2$) and one of the differential outputs 614, 613 of the operational amplifier 61. The switch sets ($US_1g$, $DS_1g$) connect one of the first capacitor sets ($UC_1g$, $DC_1g$) to one of the second capacitors ($UC_2$, $DC_2$), respectively. The switches (Sj) of the charging units (USg, DSg) connect one of the capacitor terminals of each of the first capacitors (C1, C2, ..., Cn) and the two capacitor terminals of each of the second capacitors ($UC_2$, $DC_2$) to the ground terminal. The switches (Si) of the charging units (Usg, DSg) connect each of the first capacitors (C1, C2, ..., Cn) to one of two reference voltages. A first-order converting device that is identical to the first preferred embodiment is thus formed at each of the non-inverting and inverting inputs 611, 612 of the operational amplifier 61 of this embodiment. Since the conversion operations of the two converting devices are synchronous, and since the operations thereof during the three time periods are the same as those described in connection with the first preferred embodiment, a detailed description is dispensed with herein for the sake of brevity.

Because the reference voltage connections of the switches (Si) of the charging units (Usg, DSg) are reversed, the first and second differential outputs 613, 614 of the operational amplifier 61 synchronously output signals of the same magnitude but with a phase difference of 180 degrees. Therefore, the conversion function is $$\frac{Vout}{D_1 + D_2 + \ldots + D_n} = 2Vr \frac{nC}{nC + wC} \cdot wC / (C_{FB} + wC).$$

It is evident that the magnitude of the output analog signal of the converter 6 is twice that achievable in the first preferred embodiment.

Figure 10:
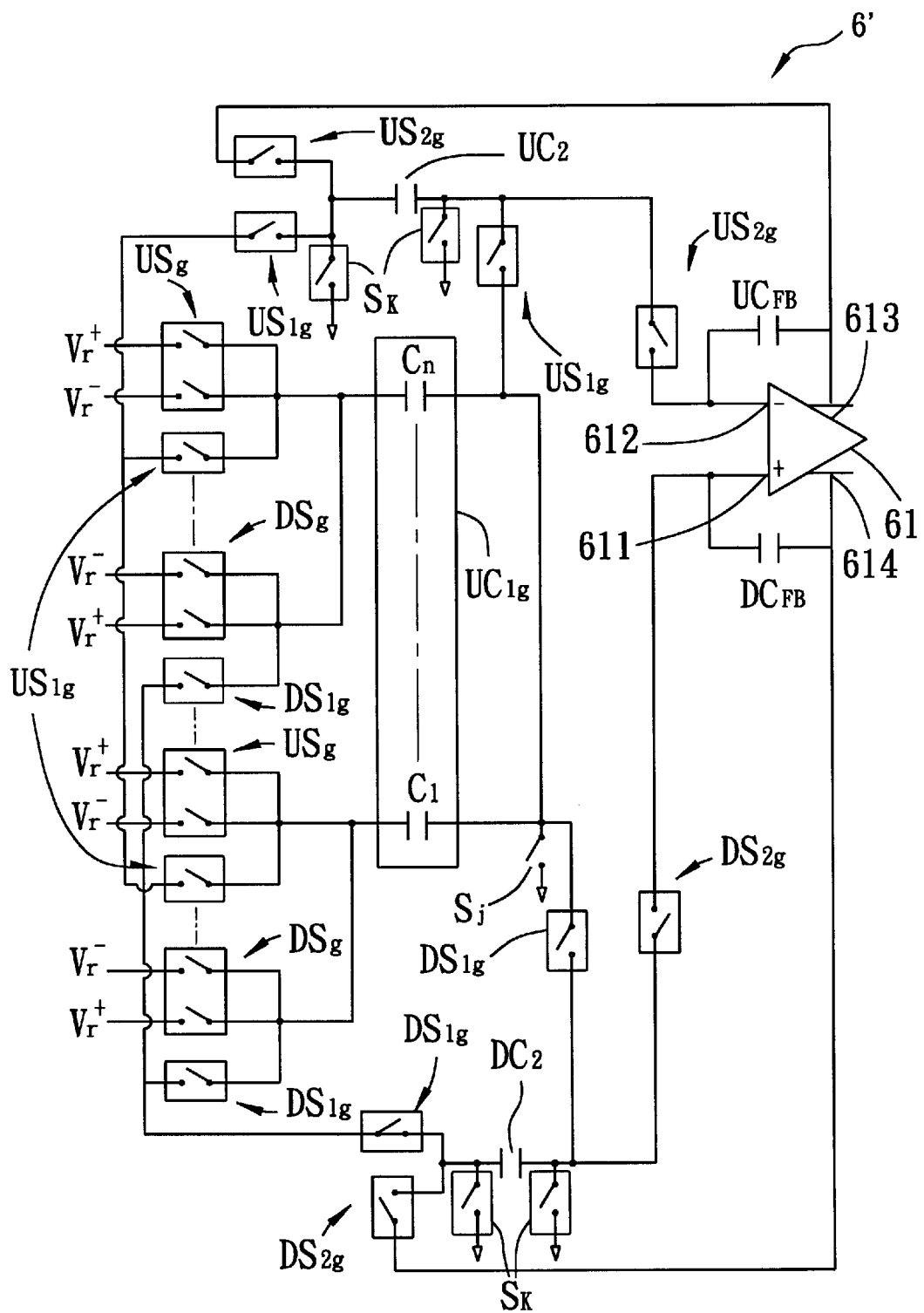
FIG. 10 is a schematic circuit diagram illustrating the fifth preferred embodiment of a digital-to-analog converter according to the present invention.
Figure 11:
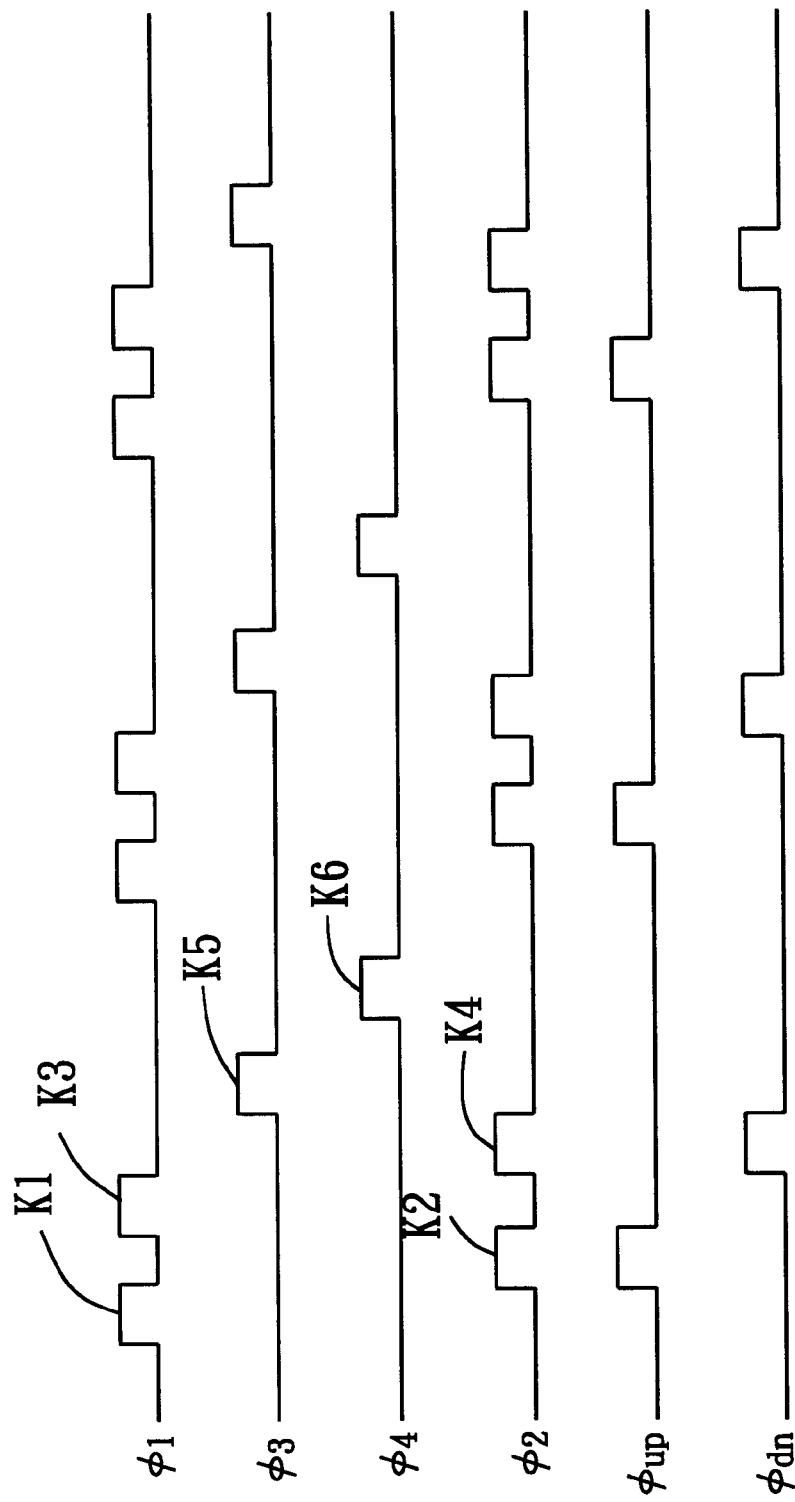
FIG. 11 is a timing diagram illustrating clock signals generated by a clock pulse generator of the converter of the fifth preferred embodiment.

Referring to FIG. 10, the fifth preferred embodiment of a digital-to-analog converter 6' of this invention is shown to be similar in construction to the fourth preferred embodiment, the main difference residing in that the capacitor sets ($UC_1g$, $DC_1g$) of the fourth preferred embodiment are integrated into a common capacitor set ($UC_1g$) having capacitor terminals connected to the ground terminal via switches (Sk) of a grounding unit. The operation of the fifth preferred embodiment will now be described with further reference to FIG. 11.

During a first clock pulse (K1) of the first time period (φ1), the switches of the upper charging unit (Usg) are closed to charge the first capacitors (C1, C2, ..., Cn) using either of the two reference voltages (Vr$^+$, Vr$^-$) according to the data bits of an input data byte. Subsequently, during a first clock pulse (K2) of the second time period ($\phi$2), i.e. sub-period ($\phi$up), which follows the first clock pulse (K1) of the first time period ($\phi$1), the upper switch set (US$_1$g) is closed to connect the first capacitors (C1, C2, ..., Cn) in parallel to the second capacitor (UC$_2$), thereby redistributing the total charges on the first capacitors (C1, C2, ..., Cn) among the first capacitors (C1, C2, ..., Cn) and the second capacitor (UC$_2$).

Thereafter, during a second clock pulse (K3) of the first time period ($\phi$1), which follows the first clock pulse (K2) of the second time period ($\phi$2), the lower charging unit (DSg) is closed so that, like the first clock pulse (K1) of the first time period ($\phi$1), the first capacitors (C1, C2, ..., Cn) are charged using either of the two reference voltages (Vr$^+$, Vr$^-$) according to the data bits of the input data byte. Next, during a second clock pulse (K4) of the second time period ($\phi$2), i.e. sub-period ($\phi$dn), which follows the second clock pulse (K3) of the first time period ($\phi$1), the lower switch set (DS$_1$g) is closed so that the first capacitors (C1, C2, ..., Cn) are connected in parallel to the second capacitor (DC$_2$) to redistribute the total charges on the first capacitors (C1, C2, ..., Cn) among the first capacitors (C1, C2, ..., Cn) and the second capacitor (DC$_2$).

Each clock pulse (K5) of the third time period ($\phi$3) occurs after each clock pulse of the sub-period ($\phi$dn). During the third time period ($\phi$3), the switches of the switch units (US$_2$g, DS$_2$g) are closed so that the second capacitors (UC$_2$, DC$_2$) are simultaneously connected in parallel to the respective one of the feedback capacitors (UC$_{FB}$, DC$_{FB}$) between a respective one of the inverting and non-inverting inputs 612, 611 and a respective one of the differential outputs 613, 614 of the operational amplifier 61. The total charges on the second capacitors (UC$_2$, DC$_2$) are redistributed to obtain the same conversion function as that of the fourth preferred embodiment, i.e., $$\frac{Vout}{D_1 + D_2 + \ldots + Dn} = 2 \quad Vr\frac{nC}{nC + wC} \cdot wC/(C_{FB} + wC).$$

An analog signal according to the aforesaid conversion function can be obtained from the operational amplifier 61 at this time. Thus, the effects of the fourth preferred embodiment can be achieved using a smaller number of capacitors.

Each clock pulse (K6) of the fourth time period $\phi$4) occurs after a corresponding clock pulse (K5) of the third clock period ($\phi$3). During the fourth time period ($\phi$4), all of the switches (Sk) are closed, thereby grounding the capacitor terminals of the second capacitors (UC$_2$, DC$_2$) to remove charges thereon.

Figure 12:
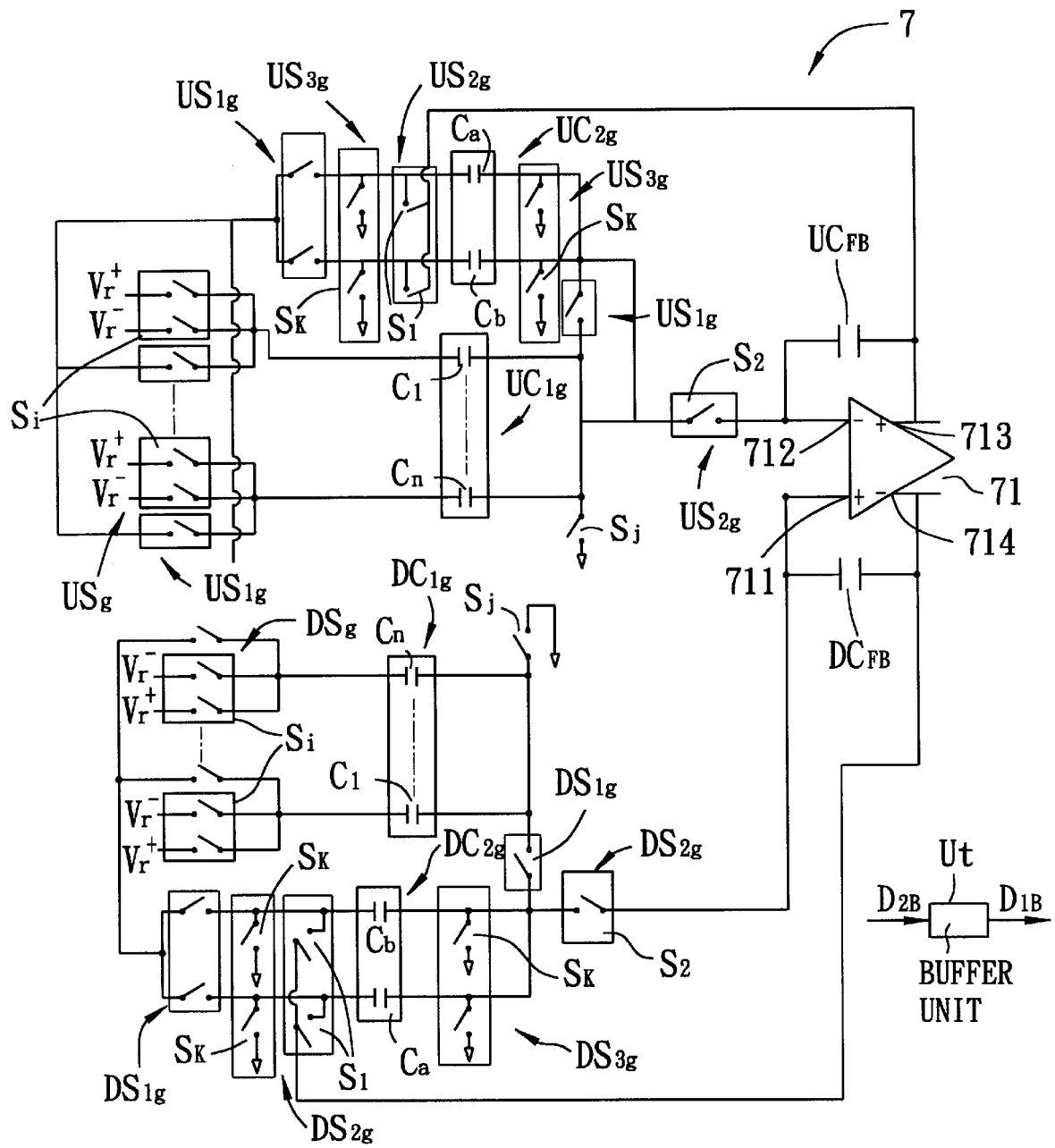
FIG. 12 is a schematic circuit diagram illustrating the sixth preferred embodiment of a digital-to-analog converter according to the present invention.

FIG. 12 illustrates the sixth preferred embodiment of a digital-to-analog converter 7 of this invention, which includes an operational amplifier 71, two first capacitor sets (UC$_1$g, DC$_1$g) each having a plurality of first capacitors (C1, C2, ..., Cn), two second capacitor sets (UC$_2$g, DC$_2$g) each having two second capacitors (Ca, Cb), two charging units (USg, DSg) each having a plurality of first switches (Si, Sj), two switch sets (US$_1$g, DS$_1$g) each having a plurality of second switches, two switch units (US$_2$g, DS$_2$g) each having a plurality of third switches (S1, S2), and two grounding units (US$_3$g, DS$_3$g) each having a plurality of fourth switches (Sk). A buffer unit (Ut) is further provided as in the second preferred embodiment to buffer consecutive input data bytes.

The operational amplifier 71 has non-inverting and inverting inputs 711, 712, first and second differential outputs 713, 714, and two feedback capacitors (UC$_{FB}$, DC$_{FB}$) connected respectively between the inverting input 712 and the first differential output 713 and between the non-inverting input 711 and the second differential output 714. In addition, the switch (S$_2$) of each of the switch units (US$_2$g, DS$_2$g) connects a respective one of the second capacitor sets (UC$_2$g, DC$_2$g) to a respective one of the inverting and non-inverting inputs 712, 711 of the operational amplifier 71. The switches (S$_1$) of each of the switch units (US$_2$g, DS$_2$g) connect a respective one of the second capacitors (Ca, Cb) of a respective one of the second capacitor sets (UC$_2$g, DC$_2$g) to a respective one of the first and second differential outputs 713, 714 of the operational amplifier 71. The switch sets (US$_1$g, DS$_1$g) connect a respective one of the first capacitor sets (UC$_1$g, DC$_1$g) to a respective one of the second capacitor sets (UC$_2$g, DC$_2$g). The switches (Sj) of the charging units (USg, DSg) connect each of the first capacitors (C1, C2, ..., Cn) of a respective one of the first capacitor sets (UC$_1$g, DC$_1$g) to the ground terminal. The switches (Si) of the charging units (USg, DSg) connect each of the first capacitors (C1, C2, ..., Cn) of a respective one of the first capacitor sets (UC$_1$g, DC$_1$g) to one of two reference voltages in a manner similar to that of the previous embodiments. The switches (Sk) of the grounding units (US$_3$g, DS$_3$g) connect the capacitor terminals of the second capacitors (Ca, Cb) of a respective one of the second capacitor sets (UC$_2$g, DC$_2$g) to the ground terminal. Thus, a second-order converting device similar to the second preferred embodiment is formed at each of the non-inverting and inverting inputs 711, 712 of the operational amplifier 71. Since the two converting devices perform conversion synchronously, and since the operations thereof during the five time periods are the same as those in the second preferred embodiment, further description is dispensed with herein for the sake of brevity.

Because the reference voltage connections of the switches (Si) of the charging units (Usg, DSg) are reversed, the first and second differential outputs 713, 714 of the operational amplifier 71 synchronously output signals of the same magnitude but with a phase difference of 180 degrees. Therefore, the conversion function is $$\frac{Vout}{D_1 + D_2 + \ldots + D_n} = 2$$

$$Vr[1 + Z^{-1}]\frac{nC}{nC + wC} \cdot wC/(C_{FB} + 2wC - C_{FB}Z^{-1}).$$

It is thus evident that the magnitude of the analog signals is twice that achievable in the second preferred embodiment.

Figure 13:
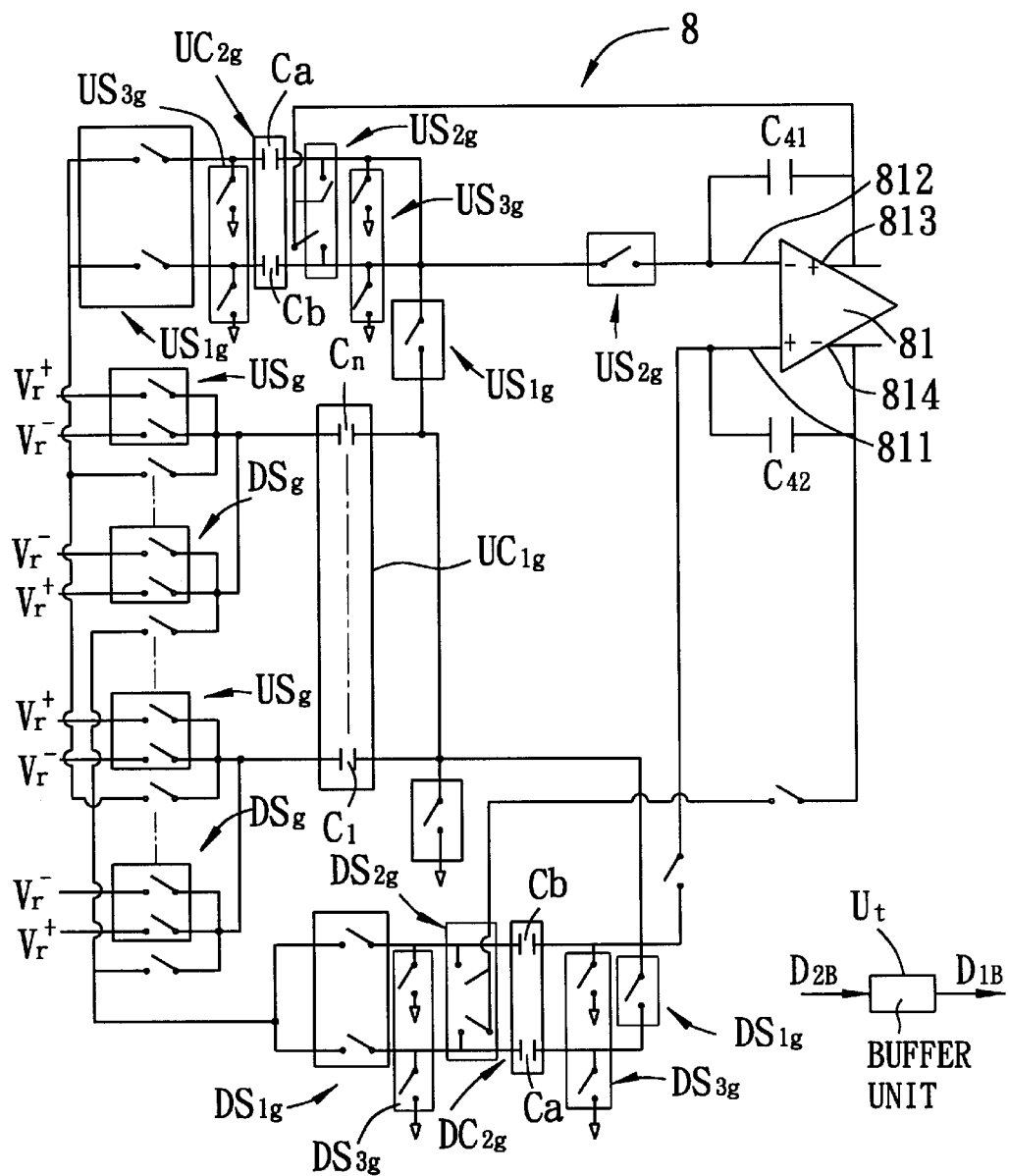
FIG. 13 is a schematic circuit diagram illustrating the seventh preferred embodiment of a digital-to-analog converter according to the present invention.
Figure 14:
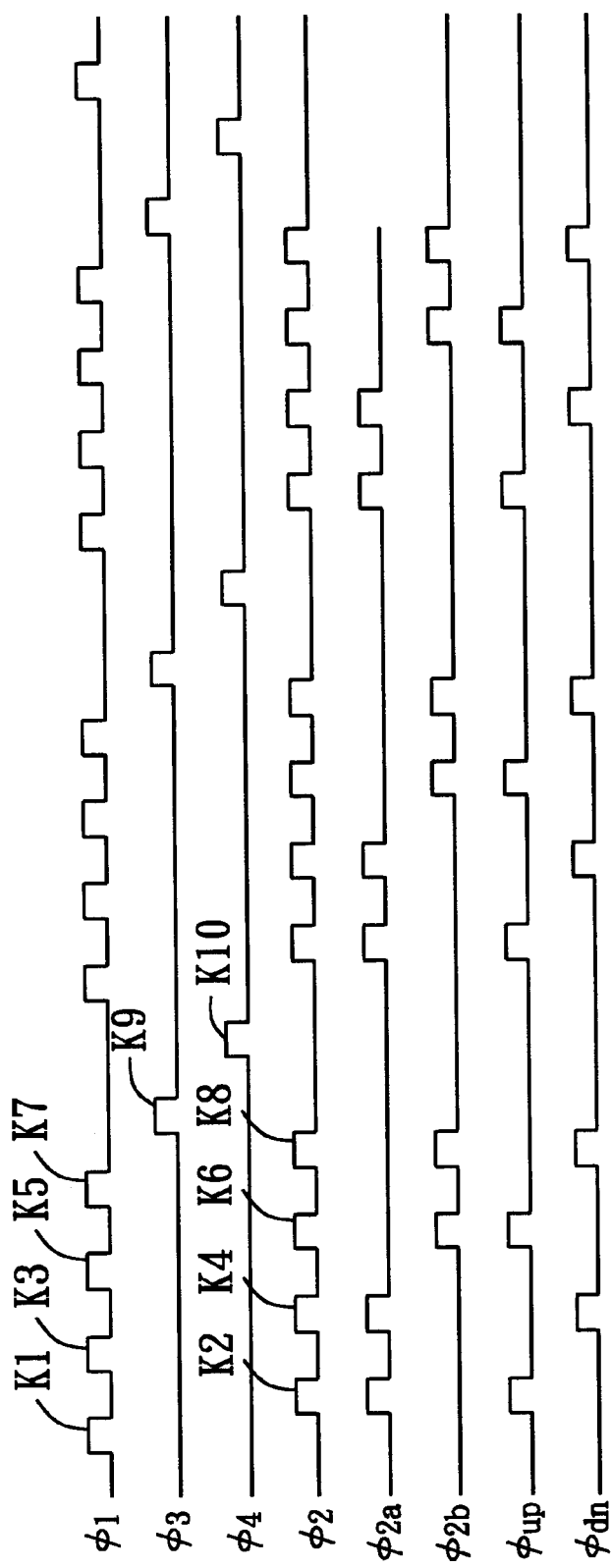
FIG. 14 is a timing diagram illustrating clock signals generated by a clock pulse generator of the converter of the seventh preferred embodiment.

In addition, the two first capacitor sets in the sixth preferred embodiment can be integrated into a common capacitor set to form the seventh preferred embodiment of a digital-to-analog converter 8 of this invention, as shown in FIG. 13. The converter 8 differs from the converter 6 of the sixth preferred embodiment mainly in that only one first capacitor set (UC$_1$g) is employed therein. The operation of the seventh preferred embodiment will now be described with further reference to FIG. 14.

During a first clock pulse (K1) of the first time period ($\phi$1), the switches of the upper charging unit (Usg) are closed to charge the first capacitors (C1, C2, ..., Cn) using either of two reference voltages (Vr$^+$, Vr$^-$) according to the data bits of an input data byte (D$_{1B}$) in the same manner as the previous embodiments. Subsequently, during a first clock pulse (K2) of the second time period ($\phi$2), i.e. sub-periods ($\phi$2a, $\phi$up), which follows the first clock pulse (K1) of the first time period ($\phi$1), the upper switch set (US$_1$g) is closed to connect the first capacitors (C1, C2, . . . , Cn) in to parallel to the second capacitor (Ca) of the upper second capacitor set (UC$_2$g), thereby redistributing the total charges on the first capacitors (C1, C2, . . . , Cn) among the first capacitors (C1, C2, . . . , Cn) and the second capacitor (Ca) of the upper second capacitor set (UC$_2$) Thereafter, during a second clock pulse (K3) of the first time period ($\phi$1), which follows the first clock pulse (K2) of the second time period ($\phi$2), the switches of the lower charging unit (DSg) are closed so that the first capacitors (C1, C2, . . . , Cn) are charged using either of the two reference voltages (Vr$^+$, Vr$^-$) according to the data bits of the input data byte (D$_{1B}$). Note that the reference voltage connections of the switches (Si) of the charging units (Usg, DSg) are reversed. Next, during a second clock pulse (K4) of the second time period ($\phi$2), i.e. sub-periods ($\phi$2a, $\phi$dn), which follows the second clock pulse (K3) of the first time period ($\phi$1), the lower switch set (DS$_1$g) is closed so that the first capacitors (C1, C2, . . . , Cn) are connected in parallel to the second capacitor (Ca) of the lower second capacitor set (DC$_2$g) to redistribute the total charges on the first capacitors (C1, C2, . . . , Cn) among the first capacitors (C1, C2 , . . . , Cn) and the second capacitor (Ca) of the lower second capacitor set (DC$_2$g).

During a third clock pulse (K5) of the first time period ($\phi$1), which follows the second clock pulse (K4) of the second time period ($\phi$2), the switches of the upper charging unit (Usg) are once again closed to charge the first capacitors (C1, C2, . . . , Cn) using either of the two reference voltages (Vr$^+$, Vr$^-$) according to the data bits of another input data byte (D$_{2B}$). Subsequently, during a third clock pulse (K6) of the second time period ($\phi$2), i.e. sub-periods ($\phi$2b, $\phi$up), which follows the third clock pulse (K5) of the first time period ($\phi$1), the upper switch set (US$_1$g) is closed to connect the first capacitors (C1, C2, . . . , Cn) in parallel to the second capacitor (Cb) of the upper second capacitor set (UC$_2$g), thereby redistributing the total charges on the first capacitors (C1, C2, . . . , Cn) among the first capacitors (C1, C2, . . . , Cn) and the second capacitor (Cb) of the upper second capacitor set (UC$_2$).

Thereafter, during a fourth clock pulse (K7) of the first time period ($\phi$1), which follows the third clock pulse (K6) of the second time period ($\phi$2), the switches of the lower charging unit (DSg) are once again closed so that the first capacitors (C1, C2, . . . , Cn) are charged using either of the two reference voltages (Vr$^+$, Vr$^-$) according to the data bits of the input data byte (D$_{2B}$). Next, during a fourth clock pulse (K8) of the second time period ($\phi$2), i.e. sub-periods ($\phi$2b, $\phi$dn), which follows the fourth clock pulse (K7) of the first time period ($\phi$1), the lower switch set (DS$_1$g) is closed so that the first capacitors (C1, C2, . . . , Cn) are connected in parallel to the second capacitor (Cb) of the lower second capacitor set (DC$_2$g) to redistribute the total charges on the first capacitors (C1, C2, . . . , Cn) among the first capacitors (C1, C2, . . . , Cn) and the second capacitor (Cb) of the lower second capacitor set (DC$_2$g).

Each clock pulse (K9) of the third time period ($\phi$3) occurs after every second clock pulse of the sub-periods ($\phi$2b, $\phi$dn). During the third time period ($\phi$3), the switch units (US$_2$g, DS$_2$g) are closed so that the second capacitor sets (UC$_2$g, DC$_2$g) are connected in parallel simultaneously to the respective one of the feedback capacitors (C$_{41}$, D$_{42}$) between a respective one of the inverting and non-inverting inputs 812, 811 and a respective one of the first and second differential outputs 813, 814 of the operational amplifier 81. The total charges on the second capacitor sets (UC$_2$g DC$_2$g) are redistributed to obtain the same conversion function as that of the sixth preferred embodiment, i.e., $$\frac{Vout}{D_1 + D_2 + \ldots + D_n} = 2Vr[1 + Z^{-1}]\frac{nC}{nC + wC} \cdot wC/(C_{FB} + 2wC - C_{FB}Z_{-1}).$$

An analog signal according to the aforesaid conversion function can be obtained from the operational amplifier 81 at this time. Thus, the effects of the sixth preferred embodiment can be achieved using a smaller number of capacitors.

Preferably, during the third time period ($\phi$3), a previous data byte will be outputted by the buffer unit (Ut), and a new data byte will be stored in the same.

The clock pulse (K10) of the fourth time period ($\phi$4) occurs after a corresponding clock pulse (K9) of the third clock period ($\phi$3). During the fourth time period ($\phi$4), the switches of the grounding units (US$_3$g, DS$_3$g) are closed, thereby grounding the capacitor terminals of the second capacitor sets (UC$_2$g, DC$_2$g) to remove charges thereon.

It can be inferred from the foregoing that the converter 8 can be further expanded to an N-order digital-to-analog converter (N being an integer greater than 2). The expanded converter differs from the converter 8 of the previous embodiment mainly in the number of the second capacitors in the second capacitor sets (UC$_2$g, DC$_2$g), the number of switches in the switch units (US$_2$g, DS$_2$G), and the use of cascaded buffer units. The N-order converter is still operable in four time periods. During the clock pulses of the first time period, the first capacitors of the first capacitor set (UC$_1$g) are charged according to data bits of input data bytes from the buffer unit. Under the control of clock pulses of the second time period, which follow the clock pulses of the first time period, the first capacitor set (UC$_1$g) is connected to each of the second capacitors of the second capacitor sets (UC$_2$g, DC$_2$G) in sequence for charge redistribution. During each clock pulse of the third time period, the second capacitor sets (UC$_2$g, DC$_2$g) are connected simultaneously and respectively to the feedback capacitors (C$_{41}$, C$_{42}$) of the operational amplifier to result in an analog output. During each clock pulse of the fourth time period, which occurs after each clock pulse of the third time period, the capacitor terminals of the second capacitors of the second capacitor sets (UC$_2$g, DC$_2$g) are grounded to remove charges thereon.

In view of the foregoing, it can be appreciated that the method and apparatus for digital-to-analog signal conversion according to this invention can achieve N-order low-pass digital-to-analog signal conversion without necessitating a significant increase in capacitance value to attain a high-order low-pass filtering effect. As compared to the conventional second-order digital-to-analog converter, the converter of this invention is compact, and the –3 DB cutoff frequency can be easily set in consideration of the costs involved. Furthermore, the hardware can be shared to achieve hardware cost savings. In addition, N-order digital-to-analog signal conversion can be performed in a differential mode to reduce output noise and improve gain.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A digital-to-analog converter comprising:
   an operational amplifier;
   a plurality of first capacitors;
   a charging unit connected to said first capacitors during a first time period for charging each of said first capacitors in accordance with an associated data bit of an input data byte;

a second capacitor;

a switch set for connecting said first capacitors to said second capacitor during a second time period that follows said first time period; and a switch unit for connecting said second capacitor to said operational amplifier during a third time period that follows said second time period.

2. The digital-to-analog converter as claimed in claim 1, further comprising a grounding unit connected to capacitor terminals of said second capacitor and operable so as to ground said capacitor terminals during said first time period.

3. The digital-to-analog converter as claimed in claim 1, wherein said operational amplifier has two inputs and an output, said switch unit connecting said second capacitor between one of said inputs and said output of said operational amplifier during said third time period.

4. The digital-to-analog converter as claimed in claim 3, wherein said operational amplifier further has a feedback capacitor connected between said one of said inputs and said output.

5. The digital-to-analog converter as claimed in claim 1, wherein said first capacitors have equal capacitance.

6. A digital-to-analog converter comprising:

an operational amplifier;

a plurality of first capacitors;

a charging unit connected to said first capacitors during a first time period for charging each of said first capacitors in accordance with an associated data bit of an input data byte;

a plurality of second capacitors;

a switch set for connecting said first capacitors to said second capacitors during a second time period, wherein clock pulses of said second time period follow clock pulses of said first time period, and wherein said switch set connects said first capacitors to each of said second capacitors in sequence under the control of the clock pulses of said second time period; and a switch unit for connecting said second capacitors simultaneously to said operational amplifier during a third time period that follows said second time period.

7. The digital-to-analog converter as claimed in claim 6, further comprising a grounding unit connected to capacitor terminals of said second capacitors and operable so as to ground said capacitor terminals during a fourth time period that follows said third time period.

8. The digital-to-analog converter as claimed in claim 6, wherein said operational amplifier has two inputs and an output, said switch unit connecting said second capacitors between one of said inputs and said output of said operational amplifier during said third time period.

9. The digital-to-analog converter as claimed in claim 8, wherein said operational amplifier further has a feedback capacitor connected between said one of said inputs and said output.

10. The digital-to-analog converter as claimed in claim 6, wherein said first capacitors have equal capacitance.

11. The digital-to-analog converter as claimed in claim 6, wherein charging of said first capacitors and sequential connection of said first capacitors to said second capacitors are performed alternatingly.

12. A digital-to-analog converter comprising:

an operational amplifier;

two first capacitor sets, each including a plurality of first capacitors;

two charging units connected respectively to said first capacitor sets during a first time period for charging each of said first capacitors of the respective one of said first capacitor sets in accordance with an associated data bit of an input data byte;

two second capacitors;

a switch set for connecting each of said first capacitor sets to a respective one of said second capacitors during a second time period that follows said first time period; and a switch unit for connecting said second capacitors simultaneously to said operational amplifier during a third time period that follows said second time period;

said operational amplifier having two inputs and two outputs, said switch unit connecting each of said second capacitors between a respective one of said inputs and a respective one of said outputs of said operational amplifier during said third time period.

13. The digital-to-analog converter as claimed in claim 12, further comprising a grounding unit connected to capacitor terminals of said second capacitors and operable so as to ground said capacitor terminals during said first time period.

14. The digital-to-analog converter as claimed in claim 12, wherein said operational amplifier further has two feedback capacitors, each of which is connected between a respective one of said inputs and a respective one of said outputs.

15. The digital-to-analog converter as claimed in claim 12, wherein said first capacitors have equal capacitance.

16. A digital-to-analog converter comprising:

an operational amplifier;

a plurality of first capacitors;

first and second charging units connected to said first capacitors during a first time period, wherein each of said first capacitors is charged by said first charging unit in accordance with an associated data bit of an input data byte during a first clock pulse of said first time period, and is charged by said second charging unit in accordance with the associated data bit of the input data byte during a second clock pulse of said first time period;

two second capacitors;

a switch set for connecting said first capacitors to said second capacitors during a second time period, wherein said switch set connects said first capacitors to one of said second capacitors after the first clock pulse of said first time period and to the other of said second capacitors after the second clock pulse of said first time period; and a switch unit for connecting said second capacitors simultaneously to said operational amplifier during a third time period that follows said second time period.

17. The digital-to-analog converter as claimed in claim 16, further comprising a grounding unit connected to capacitor terminals of said second capacitors and operable so as to ground said capacitor terminals during a fourth time period that follows said third time period.

18. The digital-to-analog converter as claimed in claim 16, wherein said operational amplifier has two inputs and two outputs, said switch unit connecting each of said second capacitors between a respective one of said inputs and a respective one of said outputs of said operational amplifier during said third time period.

19. The digital-to-analog converter as claimed in claim 18, wherein said operational amplifier further has two feedback capacitors, each of which is connected between a respective one of said inputs and a respective one of said outputs.

20. The digital-to-analog converter as claimed in claim 16, wherein said first capacitors have equal capacitance.

21. A digital-to-analog converter comprising:

an operational amplifier;

two first capacitor sets, each including a plurality of first capacitors;

two charging units connected respectively to said first capacitor sets during a first time period for charging each of said first capacitors of the respective one of said first capacitor sets in accordance with an associated data bit of an input data byte;

two second capacitor sets, each including a plurality second capacitors;

a switch set for connecting said first capacitor sets to said second capacitor sets respectively during a second time period, wherein clock pulses of said second time period follow clock pulses of said first time period, and wherein said switch set connects said first capacitors of each of said first capacitor sets to each of said second capacitors of the respective one of said second capacitor sets in sequence under the control of the clock pulses of said second time period; and a switch unit for connecting said second capacitor sets simultaneously to said operational amplifier during a third time period that follows said second time period.

22. The digital-to-analog converter as claimed in claim 21, further comprising a grounding unit connected to capacitor terminals of said second capacitors and operable so as to ground said capacitor terminals during a fourth time period that follows said third time period.

23. The digital-to-analog converter as claimed in claim 21, wherein said operational amplifier has two inputs and two outputs, said switch unit connecting each of said second capacitor sets between a respective one of said inputs and a respective one of said outputs of said operational amplifier during said third time period.

24. The digital-to-analog converter as claimed in claim 23, wherein said operational amplifier further has two feedback capacitors, each of which is connected between a respective one of said inputs and a respective one of said outputs.

25. The digital-to-analog converter as claimed in claim 21, wherein said first capacitors have equal capacitance.

26. A digital-to-analog converter comprising:

an operational amplifier;

a first capacitor set including a plurality of first capacitors;

first and second charging units connected to said first capacitor set during a first time period, wherein each of said first capacitors is charged by said first charging unit in accordance with an associated data bit of an input data byte during a first clock pulse of said first time period, and is charged by said second charging unit in accordance with the associated data bit of the input data byte during a second clock pulse of said first time period;

two second capacitors sets each including a plurality of second capacitors;

a switch set for connecting said first capacitor set alternately to said second capacitor sets during a second time period, wherein clock pulses of said second time period follow clock pulses of said first time period, and wherein said switch set connects said first capacitor set to each of said second capacitors of said second capacitor sets in sequence under the control of the clock pulses of said second time period; and a switch unit for connecting said second capacitor sets simultaneously to said operational amplifier during a third time period that follows said second time period.

27. The digital-to-analog converter as claimed in claim 26, further comprising a grounding unit connected to capacitor terminals of said second capacitors and operable so as to ground said capacitor terminals during a fourth time period that follows said third time period.

28. The digital-to-analog converter as claimed in claim 26, wherein said operational amplifier has two inputs and two outputs, said switch unit connecting each of said second capacitor sets between a respective one of said inputs and a respective one of said outputs of said operational amplifier during said third time period.

29. The digital-to-analog converter as claimed in claim 28, wherein said operational amplifier further has two feedback capacitors, each of which is connected between a respective one of said inputs and a respective one of said outputs.

30. The digital-to-analog converter as claimed in claim 26, wherein said first capacitors have equal capacitance.

31. A digital-to-analog signal conversion method comprising:

during a first time period, charging each of a plurality of first capacitors in accordance with an associated data bit of an input data byte;

during a second time period that follows the first time period, connecting the first capacitors to a second capacitor; and during a third time period that follows the second time period, connecting the second capacitor to an operational amplifier.

32. The digital-to-analog signal conversion method as claimed in claim 31, further comprising the step of grounding capacitor terminals of the second capacitor during the first time period.

33. The digital-to-analog signal conversion method as claimed in claim 31, wherein the second capacitor is connected between one of two inputs and an output of the operational amplifier during the third time period.

34. The digital-to-analog signal conversion method as claimed in claim 31, wherein each of the first capacitors is charged to a higher voltage when the associated data bit has a high logic level, and to a lower voltage when the associated data bit has a low logic level.

35. A digital-to-analog signal conversion method comprising:

during a first time period, charging each of a plurality of first capacitors in accordance with an associated data bit of an input data byte;

during a second time period having clock pulses that follow clock pulses of the first time period, connecting the first capacitors to each of a plurality of second capacitors in sequence under the control of the clock pulses of the second time period; and during a third time period that follows the second time period, connecting the second capacitors simultaneously to an operational amplifier.

36. The digital-to-analog signal conversion method as claimed in claim 35, further comprising the step of grounding capacitor terminals of the second capacitors during a fourth time period that follows the third time period.

37. The digital-to-analog signal conversion method as claimed in claim 35, wherein the second capacitors are connected between one of two inputs and an output of the operational amplifier during the third time period.

38. The digital-to-analog signal conversion method as claimed in claim 35, wherein each of the first capacitors is charged to a higher voltage when the associated data bit has a high logic level, and to a lower voltage when the associated data bit has a low logic level.

39. A digital-to-analog signal conversion method comprising:

during a first time period, charging each of a plurality of first capacitors of two first capacitor sets in accordance with an associated data bit of an input data byte;

during a second time period that follows the first time period, connecting each of the first capacitor sets to a respective one of two second capacitors; and during a third time period that follows the second time period, connecting the second capacitors simultaneously to an operational amplifier such that each of the second capacitors is connected between a respective one of two inputs and a respective one of two outputs of the operational amplifier.

40. The digital-to-analog signal conversion method as claimed in claim 39, further comprising the step of grounding capacitor terminals of the second capacitors during the first time period.

41. The digital-to-analog signal conversion method as claimed in claim 39, wherein each of the first capacitors is charged to a higher voltage when the associated data bit has a high logic level, and to a lower voltage when the associated data bit has a low logic level.

42. A digital-to-analog signal conversion method comprising:

during a first clock pulse of a first time period, charging each of a plurality of first capacitors using a first charging unit in accordance with an associated data bit of an input data byte;

during a second clock pulse of the first time period, charging each of the first capacitors using a second charging unit in accordance with the associated data bit of the input data byte;

during a second time period, connecting the first capacitors to one of two second capacitors after the first clock pulse of the first time period and to the other of the second capacitors after the second clock pulse of the second time period; and during a third time period that follows the second time period, connecting the second capacitors simultaneously to an operational amplifier.

43. The digital-to-analog signal conversion method as claimed in claim 42, further comprising the step of grounding capacitor terminals of the second capacitors during a fourth time period that follows the third time period.

44. The digital-to-analog signal conversion method as claimed in claim 42, wherein each of the second capacitors is connected between a respective one of two inputs and a respective one of two outputs of the operational amplifier during the third time period.

45. The digital-to-analog signal conversion method as claimed in claim 42, wherein each of the first capacitors is charged to a higher voltage when the associated data bit has a high logic level, and to a lower voltage when the associated data bit has a low logic level.

46. A digital-to-analog signal conversion method comprising:

during a first time period, charging each of two first capacitor sets in accordance with an input data byte;

during a second time period having clock pulses that follow clock pulses of the first time period, connecting each of the first capacitor sets to each second capacitor of a respective second capacitor set in sequence under the control of the clock pulses of said second time period; and during a third time period that follows the second time period, connecting the second capacitor sets simultaneously to an operational amplifier.

47. The digital-to-analog signal conversion method as claimed in claim 46, further comprising the step of grounding capacitor terminals of the second capacitors during a fourth time period that follows the third time period.

48. The digital-to-analog signal conversion method as claimed in claim 46, wherein each of the second capacitor sets is connected between a respective one of two inputs and a respective one of two outputs of the operational amplifier during the third time period.

49. A digital-to-analog signal conversion method comprising:

during a first clock pulse of a first time period, charging each of a plurality of first capacitors of a first capacitor set using a first charging unit in accordance with an associated data bit of an input data byte;

during a second clock pulse of the first time period, charging each of the first capacitors using a second charging unit in accordance with the associated data bit of the input data byte;

during a second time period having clock pulses that follow the clock pulses of the first time period, connecting the first capacitor set alternately to two second capacitor sets such that the first capacitor set is connected to each of a plurality of second capacitors of the second capacitor sets in sequence under the control of the clock pulses of the second time period; and during a third time period that follows the second time period, connecting the second capacitor sets simultaneously to an operational amplifier.

50. The digital-to-analog signal conversion method as claimed in claim 49, further comprising the step of grounding capacitor terminals of the second capacitors during a fourth time period that follows the third time period.

51. The digital-to-analog signal conversion method as claimed in claim 49, wherein each of the second capacitor sets is connected between a respective one of two inputs and a respective one of two outputs of the operational amplifier during the third time period.

52. The digital-to-analog signal conversion method as claimed in claim 49, wherein each of the first capacitors is charged to a higher voltage when the associated data bit has a high logic level, and to a lower voltage when the associated data bit has a low logic level.

* * * * *